(12) United States Patent
Sio et al.

(10) Patent No.: US 11,652,102 B2
(45) Date of Patent: May 16, 2023

(54) INTEGRATED CIRCUIT STRUCTURE AND METHOD OF FORMING THE SAME

(71) Applicant: TAIWAN SEMICONDUCTOR MANUFACTURING COMPANY, LTD., Hsinchu (TW)

(72) Inventors: Kam-Tou Sio, Hsinchu (TW); Chih-Liang Chen, Hsinchu (TW); Charles Chew-Yuen Young, Hsinchu (TW); Hui-Zhong Zhuang, Hsinchu (TW); Jiann-Tyng Tzeng, Hsinchu (TW); Yi-Hsun Chiu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 54 days.

(21) Appl. No.: 17/132,447

(22) Filed: Dec. 23, 2020

(65) Prior Publication Data

US 2021/0118868 A1 Apr. 22, 2021

Related U.S. Application Data

(60) Continuation of application No. 16/940,334, filed on Jul. 27, 2020, now Pat. No. 10,879,229, which is a
(Continued)

(51) Int. Cl.
*H01L 27/085* (2006.01)
*H01L 27/02* (2006.01)
(Continued)

(52) U.S. Cl.
CPC ........ *H01L 27/085* (2013.01); *H01L 27/0207* (2013.01); *H01L 27/092* (2013.01);
(Continued)

(58) Field of Classification Search
CPC ................. H01L 27/118; H01L 27/085; H01L 27/092; H01L 27/0207; H01L 27/11807; H01L 21/823892
See application file for complete search history.

(56) References Cited

U.S. PATENT DOCUMENTS 8,443,306 B1 * 5/2013 Dhong ................ H01L 27/1203
326/103
8,710,906 B1 * 4/2014 Jarrar .................... H01L 21/761
327/537

(Continued)

FOREIGN PATENT DOCUMENTS

| KR | 20140036446 | 3/2014 |
| KR | 20140043451 | 4/2014 |

OTHER PUBLICATIONS

Office Action dated Dec. 11, 2018 from corresponding application No. KR 10-2017-0162056.
(Continued)

*Primary Examiner* — Errol V Fernandes
*Assistant Examiner* — Jeremy J Joy
(74) *Attorney, Agent, or Firm* — Hauptman Ham, LLP

(57) ABSTRACT

An integrated circuit structure includes a first well, a second well, a third well, a first set of implants and a second set of implants. The first well includes a first dopant type, a first portion extending in a first direction and having a first width, and a second portion adjacent to the first portion of the first well, extending in the first direction and having a second width. The second well has a second dopant type and is adjacent to the first well. The third well has the second dopant type, and is adjacent to the first well. The first portion of the first well is between the second well and the third well. The first set of implants is in the first portion of the first well,
(Continued)

the second well and the third well. The second set of implants is in the second portion of the first well.

20 Claims, 18 Drawing Sheets

Related U.S. Application Data division of application No. 15/782,183, filed on Oct. 12, 2017, now Pat. No. 10,734,377.

(60) Provisional application No. 62/427,558, filed on Nov. 29, 2016.

(51) Int. Cl.
*H01L 27/092* (2006.01)
*H01L 27/118* (2006.01)
*H01L 21/8238* (2006.01)

(52) U.S. Cl.
CPC ...... *H01L 27/118* (2013.01); *H01L 27/11807* (2013.01); *H01L 21/823871* (2013.01); *H01L 21/823892* (2013.01); *H01L 2027/1189* (2013.01)

(56) References Cited

U.S. PATENT DOCUMENTS

| | | | |
|---|---|---|---|
| 9,905,560 B2* | 2/2018 | Jayapal | H01L 27/11807 |
| 2002/0164848 A1 | 11/2002 | Lee et al. | |
| 2007/0096792 A1 | 5/2007 | Cranford et al. | |
| 2012/0168875 A1* | 7/2012 | Tamaru | H01L 27/0928 257/E27.06 |
| 2012/0300536 A1 | 11/2012 | Houston | |
| 2014/0077303 A1 | 3/2014 | Baek | |
| 2014/0177312 A1* | 6/2014 | Shibata | H01L 27/1116 365/72 |
| 2014/0183602 A1* | 7/2014 | Gurumurthy | H01L 27/11803 257/202 |
| 2015/0318407 A1* | 11/2015 | Chen | H01L 23/528 257/296 |
| 2016/0111424 A1* | 4/2016 | Jayapal | H01L 27/0921 716/112 |
| 2016/0336343 A1* | 11/2016 | Kuo | H01L 27/11807 |
| 2017/0194319 A1* | 7/2017 | Xu | H01L 23/5286 |
| 2017/0213814 A1* | 7/2017 | Thazhathidathil | H01L 21/743 |
| 2017/0352649 A1* | 12/2017 | Pant | G06F 30/39 |
| 2021/0366895 A1* | 11/2021 | Chang | G06F 30/392 |

OTHER PUBLICATIONS

Notice of Allowance dated Sep. 20, 2018 from corresponding application No. TW 106141619.

* cited by examiner

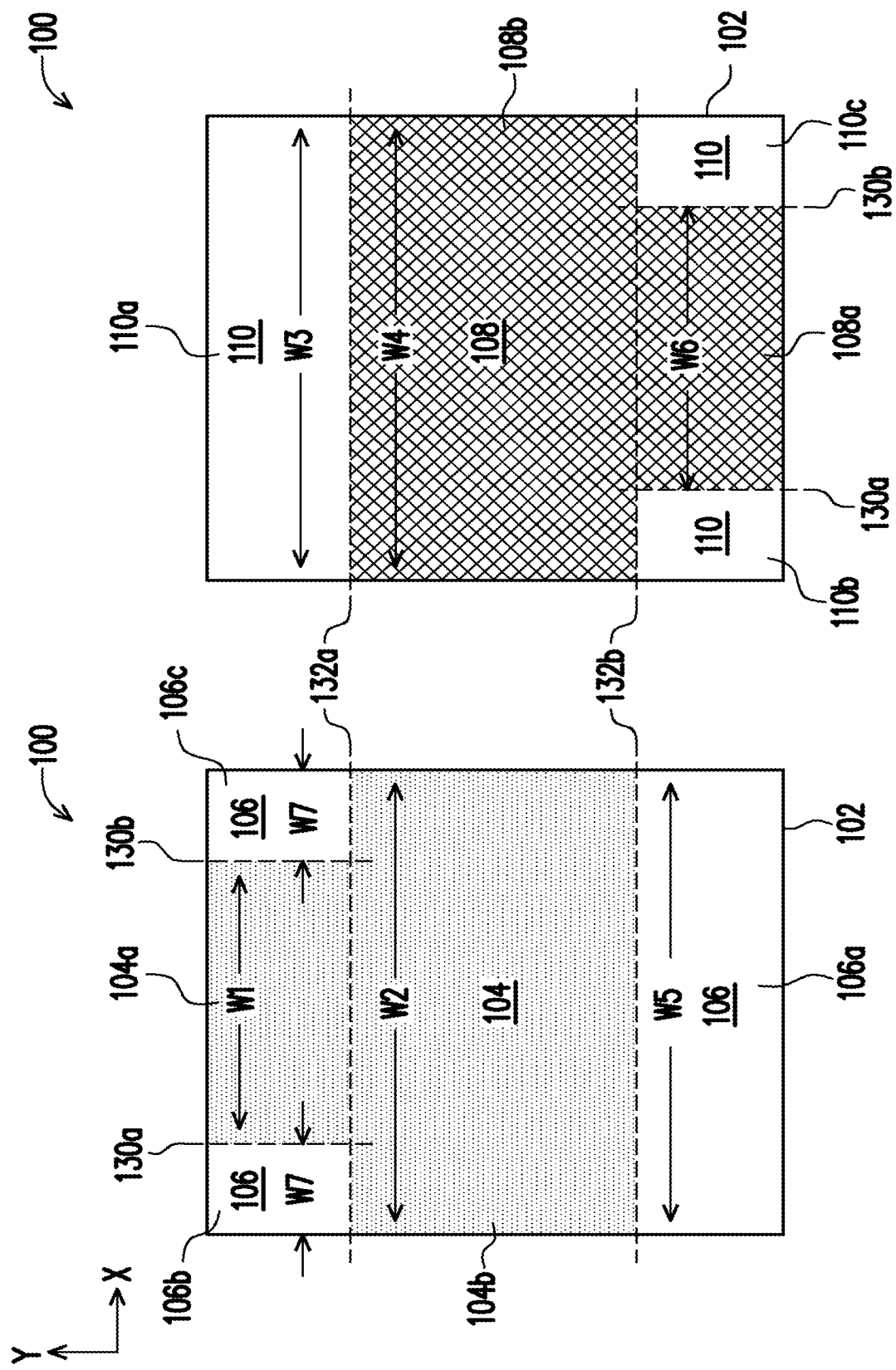

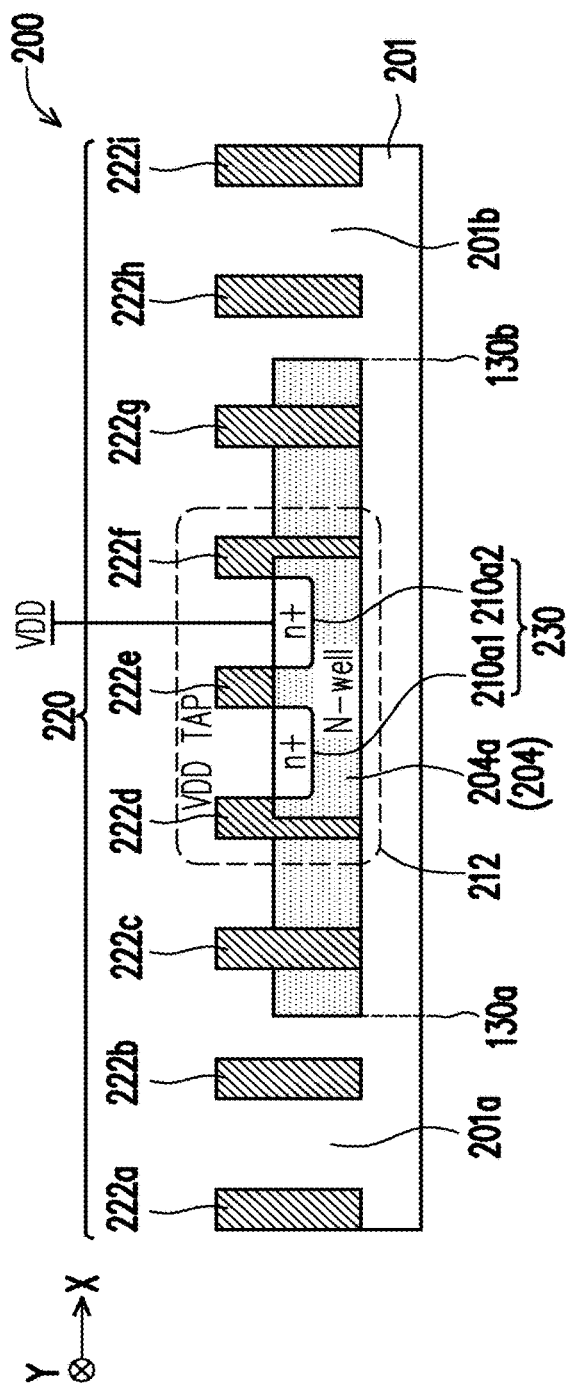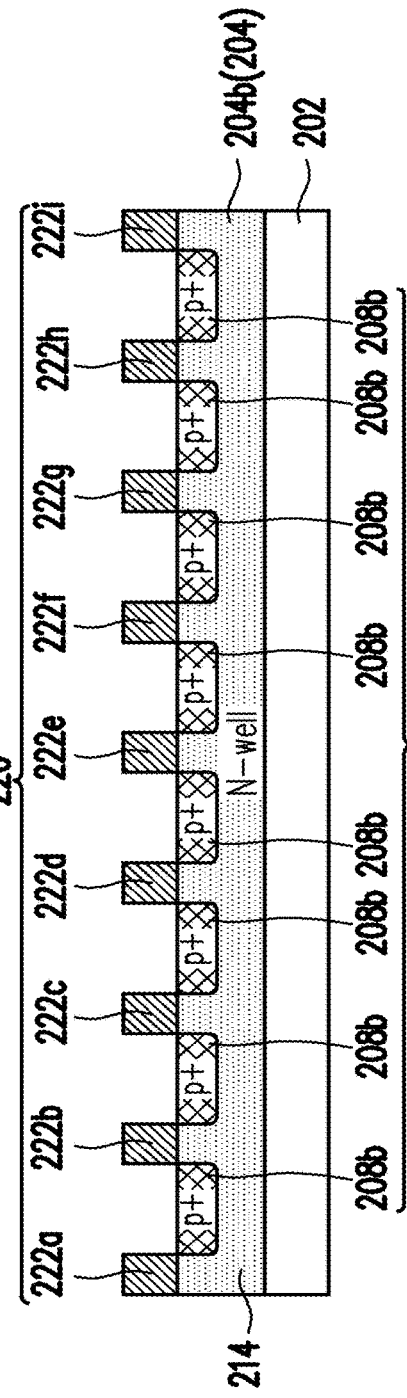

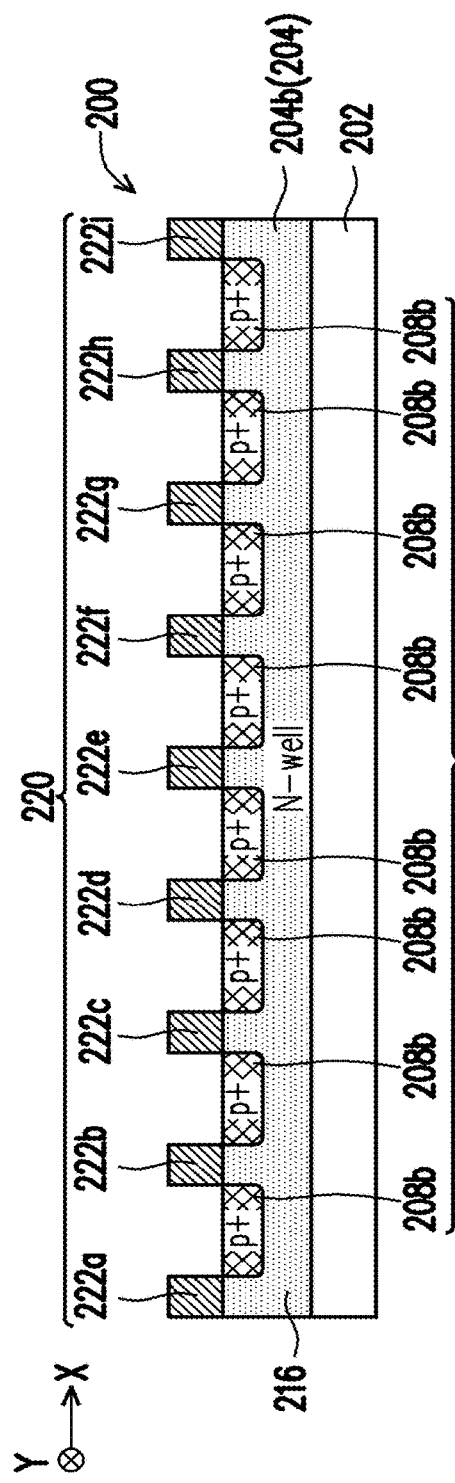
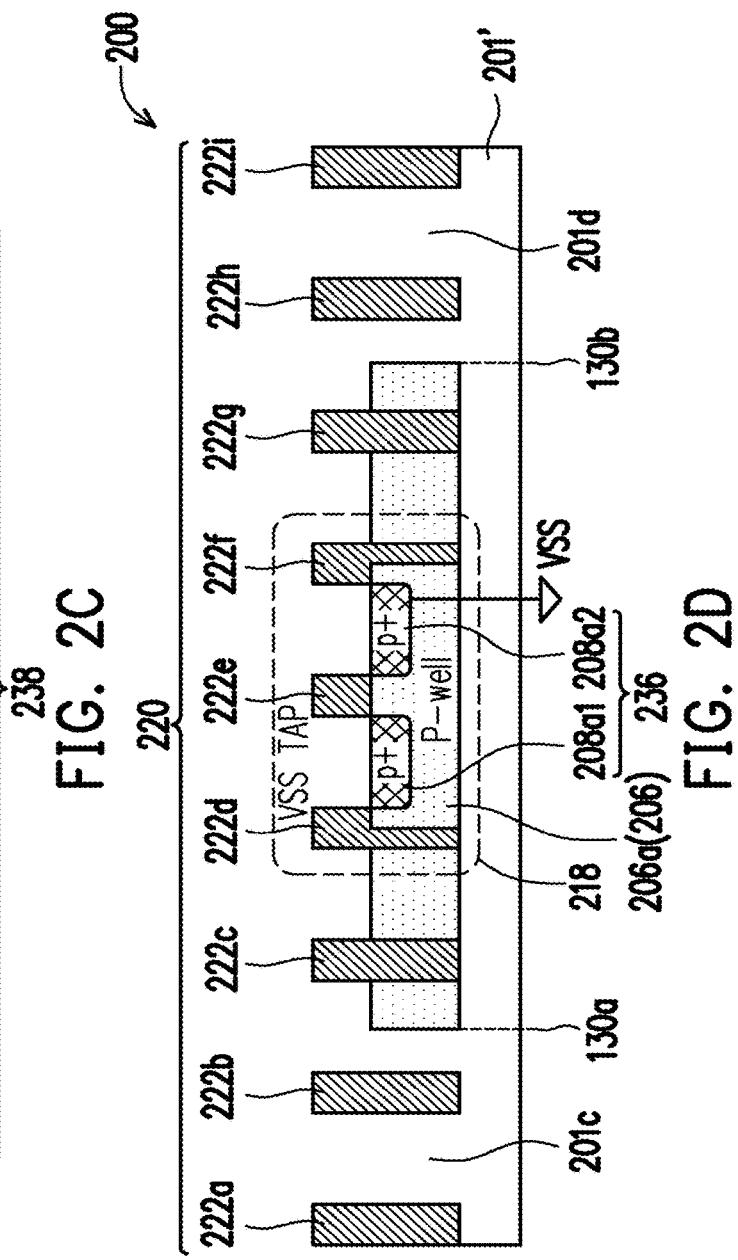
FIG. 2C
FIG. 2D

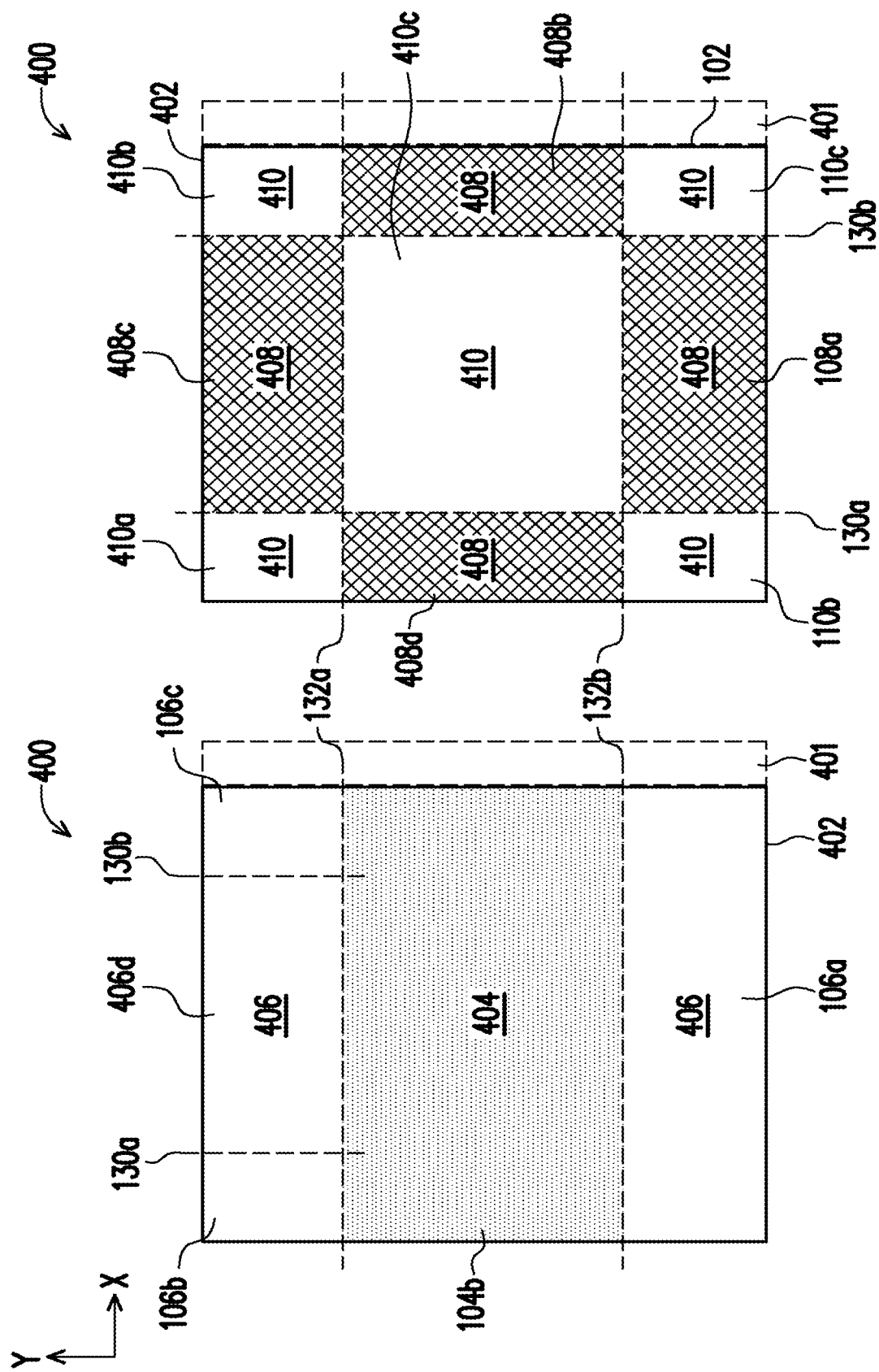

INTEGRATED CIRCUIT STRUCTURE AND METHOD OF FORMING THE SAME

PRIORITY CLAIM

The present application is a continuation of U.S. application Ser. No. 16/940,334, filed Jul. 27, 2020, now U.S. Pat. No. 10,879,229, issued Dec. 29, 2020, which is a divisional of U.S. application Ser. No. 15/782,183, filed Oct. 12, 2017, now U.S. Pat. No. 10,734,377, issued Aug. 4, 2020, which claims the priority of U.S. Provisional Application No. 62/427,558, filed Nov. 29, 2016, the disclosures of which are incorporated herein by reference in their entireties.

BACKGROUND

As integrated circuits become smaller in physical size, and the quantity of transistors included in the device increases, smaller line widths are used in the integrated circuits, and the transistors therein are located closer together. Latchup is a type of short circuit that sometimes occurs in integrated circuits. To prevent latchup, some integrated circuits include tap cells. However, tap cells may increase the overall size of the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C are diagrams of a top view of a layout design of an IC structure, in accordance with some embodiments.

FIGS. 2A-2D are diagrams of an IC structure, in accordance with some embodiments.

FIGS. 4A-4C are diagrams of a top view of a layout design of an IC structure, in accordance with some embodiments.

DETAILED DESCRIPTION

Figure 1C:
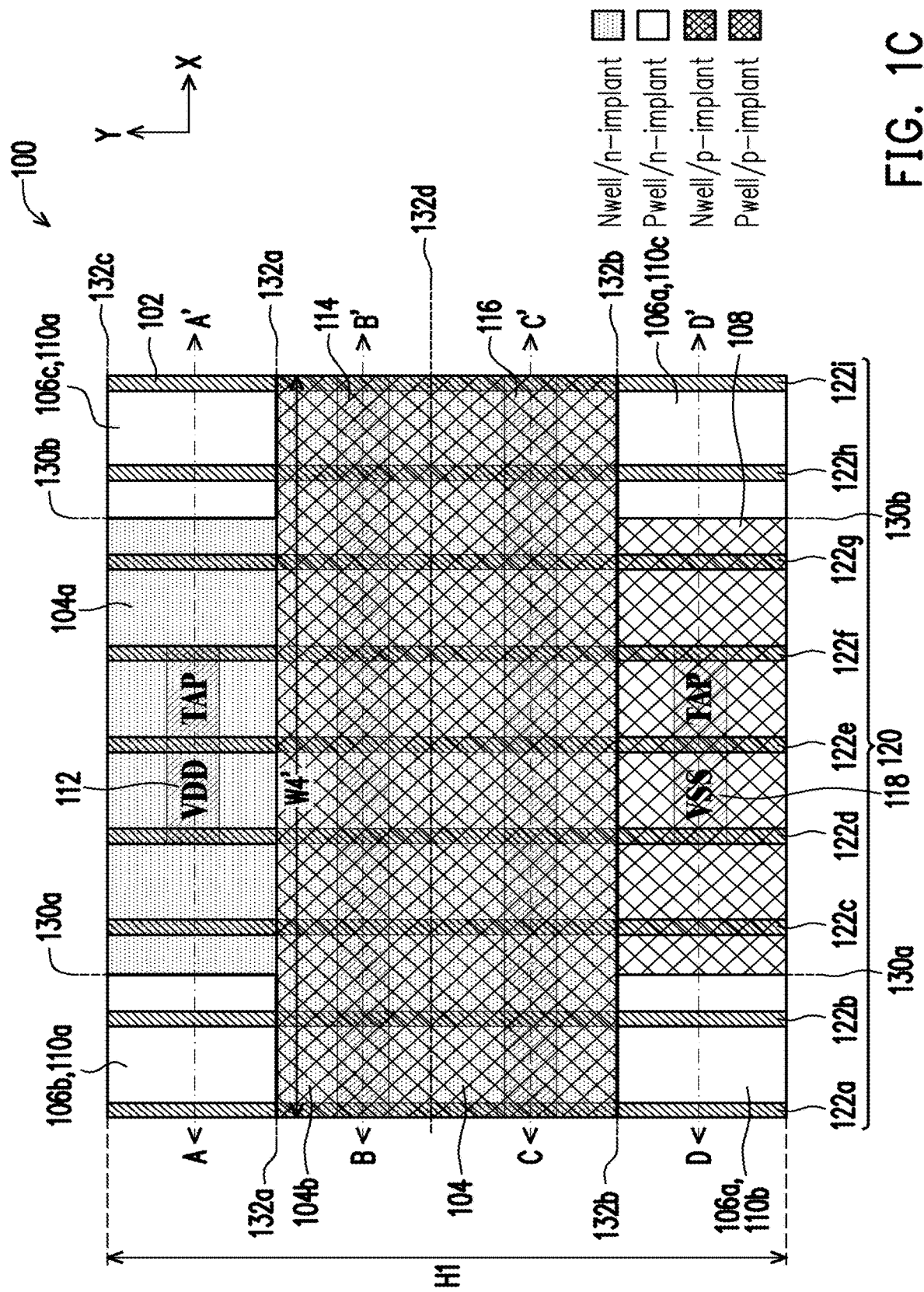

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an IC structure includes a first well in a substrate, a first set of implants and a second set of implants. The first well includes a first dopant type, a first portion extending in a first direction and having a first width, and a second portion adjacent to the first portion. The second portion extends in the first direction and has a second width greater than the first width. The first set of implants are in the first portion of the first well and the second set of implants are in the second portion of the first well. In some embodiments, the second set of implants in the second portion of the first well correspond to an active region of the IC structure. In some embodiments, the second set of implants in the second portion of the first well continuously extend in the first direction, and through a set of standard cells that are adjacent to the second set of implants. In some embodiments, in comparison with other approaches, the IC structure occupies less area than other approaches by having the second set of implants continuously extend in the first direction, and through adjacent standard cells.

FIGS. 1A-1C are diagrams of a top view of a layout design 100 of an IC structure, in accordance with some embodiments. For ease of illustration, FIG. 1A is a top view of a first layout level of layout design 100, and FIG. 1B is a top view of a second layout level of layout design 100. In some embodiments, FIG. 1C includes additional elements not shown in FIG. 1A or 1B for ease of illustration.

Layout design 100 includes a first well layout pattern 104 adjacent to a second well layout pattern 106. The first well layout pattern 104 and the second well layout pattern 106 are on a first layout level. The first well layout pattern 104 has a T-shape. The first well layout pattern 104 is usable to manufacture a first well 204 (shown in FIGS. 2A-2D) in a substrate 201 of an IC structure 200.

The first well layout pattern 104 includes a first layout pattern 104a and a second layout pattern 104b.

The first layout pattern 104a extends in a first direction X and has a first width W1. The first layout pattern 104a is usable to manufacture a corresponding first portion 204a (FIG. 2A) of the first well 204. In some embodiments, first layout pattern 104a and second layout pattern 104b are a single, continuous layout pattern. In some embodiments, first layout pattern 104a and second layout pattern 104b are discretely generated albeit continuous layout patterns.

The second layout pattern 104b is adjacent to the first layout pattern 104a. The second layout pattern 104b extends in the first direction X and has a second width W2. The second width W2 is greater than the first width W1. In some embodiments, the second width W2 is less than or equal to the first width W1. The second layout pattern 104b is usable to manufacture a corresponding second portion 204b (FIGS. 2B-C) of the first well 204.

The second well layout pattern 106 is usable to manufacture a second well 206 (shown in FIGS. 2A-2D) in the substrate 202 of the IC structure 200.

The second well layout pattern 106 includes a layout pattern 106a, a layout pattern 106b and a layout pattern 106c. Layout pattern 106a is usable to manufacture a corresponding first portion 206a of the second well 206 in substrate 201' of the IC structure 200. In some embodiments, layout patterns 106b and 106c are usable to manufacture corresponding region 201a and 201b of substrate 201 of IC structure 200 (FIG. 2A).

Layout pattern 106a is adjacent to the second layout pattern 104b. Layout pattern 106a extends in the first direction X and has a fifth width W5 greater than the first width W1. In some embodiments, the fifth width W5 is less than or equal to the first width W1.

Layout pattern 106b or 106c extends in the first direction X and has a seventh width W7 less than the second width W2. In some embodiments, the seventh width W7 is greater than or equal to the second width W2. First layout pattern 104a is adjacent to and between layout patterns 106b and 106c.

One or more edges of layout pattern 104a or 106b is aligned with a gridline 130a. Gridline 130a or 130b extends in a second direction Y which is different from the first direction X. One or more edges of layout pattern 104a or 106c is aligned with gridline 130b. One or more edges of layout pattern 104a, 106b or 106c is aligned with a gridline 132a. Gridline 132a extends in the first direction X. The second layout pattern 104b is between the first layout pattern 104a and the layout pattern 106a of the second well layout pattern 106.

Layout design 100 further includes a first set of implant layout patterns 110 (FIGS. 1B-1C) adjacent to a second set of implant layout patterns 108 (FIGS. 1B-1C). The first set of implant layout patterns 110 and the second set of implant layout patterns 108 are on a second layout level. The second layout level is different from the first layout level. The second layout level is above the first layout level. In some embodiments, the second layout level is below or the same as the first layout level.

The first set of implant layout patterns 110 includes an implant layout pattern 110a, a layout pattern 110b, and a layout pattern 110c.

Implant layout pattern 110a is usable to manufacture a corresponding first set of implants 210a1 and 210a2 (FIG. 2A) in the first portion 204a of the first well 204 of IC structure 200 (FIGS. 2A-2D). First set of implants 210a1 and 210a2 are collectively referred to as "first set of implants 230."

Layout pattern 110b or 110c is usable to manufacture a corresponding region 201c and 201d of substrate 201' of IC structure 200 (FIG. 2D).

Implant layout pattern 110a extends in the first direction X, overlaps the layout pattern 104a and has a third width W3 greater than the first width W1. In some embodiments, the third width W3 is less than or equal to the first width W1. An edge of the implant layout pattern 110a is aligned with an edge of second layout pattern 104b or an edge of layout pattern 106b or 106c along gridline 132a.

Implant layout pattern 110b or 110c is over layout pattern 106a. An edge of the implant layout pattern 110b or 110c is aligned with an edge of layout pattern 106a or an edge of second layout pattern 104b along gridline 132b.

The second set of implant layout patterns 108 includes an implant layout pattern 108a and an implant layout pattern 108b. The second set of implant layout patterns 108 have a T-shape.

Implant layout pattern 108a is usable to manufacture a corresponding second set of implants 208a1, 208a2 (FIG. 2D) in the first portion 206a of the second well 206 of the IC structure 200 (FIG. 2D). Second set of implants 208a1, 208a2 are collectively referred to as the "second set of implants 236." Implant layout pattern 108b is usable to manufacture a corresponding third set of implants 208b (collectively referred to as "third set of implants 238") in the second portion 204b of the first well 204 of the IC structure 200 (FIGS. 2B-2C).

Implant layout pattern 108b is adjacent to and in between implant layout pattern 108a and implant layout pattern 110a. Implant layout pattern 108b extends in the first direction X, is over the second layout pattern 104b and has a fourth width W4. An edge of the implant layout pattern 108b is aligned with an edge of second layout pattern 104b along gridline 132a or 132b.

Implant layout pattern 108a extends in the first direction X, is over the layout pattern 106a and has a sixth width W6. The sixth width W6 is less than the fourth width W4 or the fifth width W5. In some embodiments, the sixth width W6 is greater than or equal to at least one of the fourth width W4 or the fifth width W5.

Implant layout pattern 108a is between gridlines 130a and 130b. An edge of implant layout pattern 108a is aligned with gridline 130a, 130b. An edge of the implant layout pattern 108a is aligned with an edge of layout pattern 106a along gridline 132b. Implant layout pattern 108a is between implant layout patterns 110b and 110c. In some embodiments, implant layout pattern 108a and implant layout pattern 108b are a single, continuous layout pattern. In some embodiments, implant layout pattern 108a and implant layout pattern 108b are discretely generated albeit continuous layout patterns.

Implant layout pattern 108b is between the implant layout pattern 110a and the implant layout pattern 108a.

As shown in FIG. 1C, layout design 100 further includes an active region 112 (FIG. 1C), an active region 114, an active region 116 and an active region 118.

Active region 112, 114, 116 or 118 is a portion of layout design 100 representing an active region (or oxide-definition (OD) regions) in IC structure 200. In some embodiments, at least one of active region 112, 114, 116 or 118 represents at least one drain region or source region of a transistor device. In some embodiments, layout design 100 corresponds to a layout design of a tap cell. In some embodiments, a tap cell is a region of the IC structure 200 (shown in FIGS. 2A-2D) utilized to provide a bias voltage (e.g., VDD or VSS) for substrate 201, 201' or 202, first well 204 or second well 206.

Active region 112 represents the portion of the layout design 100 coupled to the first supply voltage VDD to provide the first supply voltage VDD as a bias voltage to the first set of implants 230 of the first well 204. In some embodiments, active region 112 represents the portion of the layout design 100 coupled to the second supply voltage VSS to provide the second supply voltage VSS as the bias voltage to the first set of implants 230 of the first well 204.

Active region 118 represents the portion of the layout design 100 coupled to the second supply voltage VSS to provide the second supply voltage VSS as the bias voltage to the second set of implants 236 of the second well 206. In some embodiments, active region 118 represents the portion of the layout design 100 coupled to the first supply voltage VDD to provide the first supply voltage VDD as the bias voltage to the second set of implants 236 of the second well 206.

Active region 112 or active region 118 extends in the first direction X between gate layout patterns 122d and 122f.

Active region 114 or 116 extends in the first direction X continuously through layout design 100. For example, in the first direction X, the active region 114 or 116 extends beyond an edge of gate layout pattern 122a or 122f. A width of the active region 112 or 118 is less than a width of active region 114 or 116. The width of active region 112 is equal to the width of active region 118. In some embodiments, the width of active region 112 is different than the width of active region 118. The width of active region 114 is the same as the width of active region 116. In some embodiments, the width of active region 114 is different than the width of active region 116. Layout design 100 has a height H1 in the second direction Y.

Layout design 100 further includes a set of gate layout patterns 122a, . . . , 122i (collectively referred to as "set of gate layout patterns 120") on a third layout level. Other configurations or numbers of gate layout patterns in the set of gate layout patterns 120 is within the scope of the present disclosure. Third layout level is different from the first layout level or the second layout level. The third layout level is above the first or second layout level. In some embodiments, the third layout level is below or the same as the first layout level or the second layout level. In some embodiments, the third layout level is between the first layout level and the second layout level.

The set of gate layout patterns 120 extend in the second direction Y and overlap the first well layout pattern 104 and the second well layout pattern 106. Each gate layout pattern of the set of gate layout patterns 120 extends in the second direction Y, and is separated from each other in the first direction X. The set of gate layout patterns 120 is usable to manufacture a corresponding set of gates 220 (FIGS. 2A-2D) in IC structure 200.

In some embodiments, second layout pattern 104b, implant layout pattern 108b and at least active region 114 or 116 extend continuously through the edges of layout design 100 or through adjacent cells (e.g., shown in FIGS. 3A-3C or 6-8). In some embodiments, by continuously extending the second layout pattern 104b, implant layout pattern 108b or active region 114, 116 through the edges of layout design 100 or through adjacent cells (e.g., shown in FIGS. 3A-3C or 6-8) results in the width W2 of the second layout pattern 104b, the width W4 of the implant layout pattern 108b or the width W4' of the active region 114, 116 being increased causing an increase in the compressive strain of IC structure 200 (e.g., shown in FIGS. 2A-2D) and layout design 100 compared to other approaches. By increasing the compressive strain of IC structure 200 (e.g., shown in FIGS. 2A-2D) and layout design 100, the driving current capability of IC structure 200 and layout design 100 is increased, and IC structure 200 and layout design 100 have better performance than other approaches. In some embodiments, by having an improved compressive strain, IC structure 200 or layout design 100 can have similar driving current capability as other approaches while occupying less area than the other approaches resulting in an overall reduction in physical size of layout design 100 or IC structure 200. In some embodiments, by the second width W2 of second layout pattern 104b being greater than the first width W1 of first layout pattern 104a, or the width W4 of implant layout pattern 108b being greater than the width W6 of implant layout pattern 108a, or the width W4' of the active region 114, 116 being greater than the width W1 of the active region, at least the second layout pattern 104b, implant layout pattern 108b or active region 114 or 116 extends continuously through the edges of layout design 100 or through adjacent cells (e.g., shown in FIGS. 3A-3C or 6-8). In some embodiments, the active region 114 or active region 116 have at least one SiGe channel (not labelled). In some embodiments, by continuously extending active region 114 or active region 116 through the edges of layout design 100 or through adjacent cells (e.g., shown in FIGS. 3A-3C or 6-8), causes an increase in the compressive strain of the SiGe channel of IC structure 200 (e.g., shown in FIGS. 2A-2D) and layout design 100 compared to other approaches. In some embodiments, by increasing the compressive strain of the SiGe channel of IC structure 200 (e.g., shown in FIGS. 2A-2D) and layout design 100, the advantages for the SiGe channel of IC structure 200 and layout design 100 are maximized, including one or more of an increased current gain and increased driving current capability of IC structure 200 and layout design 100. In some embodiments, by having an improved compressive strain of the SiGe channel of layout design 100 or IC structure 200, IC structure 200 or layout design 100 can have similar driving current capability as other approaches while occupying less area than the other approaches resulting in an overall reduction in physical size of layout design 100 or IC structure 200. In some embodiments, IC structure 200 or layout design 100 can have similar driving current capability as other approaches while occupying 60% less area than the other approaches resulting in at least an overall 2.5% reduction in physical area of IC structure 200.

In some embodiments, the at least one SiGe channel in active region 114 or 116 results in integrated circuits (i.e., integrated circuit 200) having SiGe channels that provide 30% to 50% more current than other approaches (e.g., Si channels). In some embodiments, by continuously extending active region 114 or active region 116 through the edges of layout design 100 or through adjacent standard cells (e.g., shown in FIGS. 3A-3C or 6-8), layout design 100 does not have a break in active region 114 and active region 116 through layout design 100 resulting in less ion degradation within layout design 100 and also along the edge of layout design 100 thereby causing improved driving current capability over other approaches.

FIGS. 2A, 2B, 2C and 2D are diagrams of an IC structure 200, in accordance with some embodiments. FIG. 2A is a cross-sectional view of IC structure 200 corresponding to layout design 100 as intersected by plane A-A', FIG. 2B is a cross-sectional view of IC structure 200 corresponding to layout design 100 as intersected by plane B-B', and FIG. 2C is a cross-sectional view of IC structure 200 corresponding to layout design 100 as intersected by plane C-C', and FIG. 2D is a cross-sectional view of IC structure 200 corresponding to layout design 100 as intersected by plane D-D', in accordance with some embodiments. IC structure 200 is manufactured by layout design 100.

IC structure 200 includes a first well 204 and a second well 206. The first well 204 includes a first dopant type impurity. The first dopant type is an n-type dopant impurity.

In some embodiments, the first dopant type is a p-type dopant impurity. The first well 204 includes a first portion 204a and a second portion 204b. The first portion 204a (FIG. 2A) of the first well 204 is in substrate 201. The first portion 204a extends in the second direction Y from gridline 130a to gridline 130b. The second portion 204b (FIGS. 2B-2C) of the first well 204 is in substrate 202. In some embodiments, substrate 201 or 201' includes Si, Ge, SiGe, InAs, InGaAs, InAlAs, InP, or the like. In some embodiments, substrate 202 includes SiGe, Si, Ge, InAs, InGaAs, InAlAs, InP, or the like. In some embodiments, the first well 204 includes Si, Ge, SiGe, InAs, InGaAs, InAlAs, InP, or the like. In some embodiments, the second well 206 includes Si, Ge, SiGe, InAs, InGaAs, InAlAs, InP, or the like.

The second well 206 (FIG. 2D) includes a second dopant type impurity. The second dopant type is a p-type dopant impurity. In some embodiments, the second dopant type is an n-type dopant impurity. The second well 206 includes a first portion 206a. The first portion 206a (FIG. 2D) of the second well 206 is in substrate 201'. The first portion 206a of the second well 206 has the second dopant type (e.g., p-type). In some embodiments, the first portion 206a of the second well 206 has the first dopant type (e.g., n-type). The first portion 206a extends in the second direction Y from gridline 130a to gridline 130b.

IC structure 200 further includes a first set of implants 230 (FIG. 2A), a second set of implants 236 (FIG. 2D) and a third set of implants 238 (FIGS. 2B-2C). In some embodiments, first set of implants 230 includes P, As, or the like. In some embodiments, second set of implants 236 includes B, Ga, or the like. In some embodiments, third set of implants 238 includes B, Ga, or the like.

Implants 210a1 and 210a2, of the first set of implants 230 (FIG. 2A) are within the first portion 204a of the first well 204.

In some embodiments, each implant of the first set of implants 230 has the first dopant type (e.g., n-type), extends in the second direction Y, and is separated from each other in the first direction X. In some embodiments, at least one implant of the first set of implants 230 is configured to be coupled to the first supply voltage VDD. In some embodiments, at least one implant of the first set of implants 230 has the second dopant type (e.g., p-type) and is configured to be coupled to the second supply voltage VSS.

Implants 208a1 and 208a2 of the second set of implants 236 (FIG. 2D) are within the first portion 206a of the second well 206. In some embodiments, each implant of the second set of implants 236 has the second dopant type (e.g., p-type), extends in the second direction Y, and is separated from each other in the first direction X. In some embodiments, at least one implant of the second set of implants 236 is configured to be coupled to the second supply voltage VSS. In some embodiments, at least one implant of the second set of implants 236 has the first dopant type (e.g., n-type) and is configured to be coupled to the first supply voltage VDD.

Implants 208b of the third set of implants 238 (FIGS. 2B-2C) are within the second portion 204b of the first well 204. In some embodiments, each implant of the third set of implants 238 has the second dopant type (e.g., p-type), extends in the second direction Y and is separated from each other in the first direction X. In some embodiments, at least one implant of the third set of implants 238 has the first dopant type (e.g., n-type).

IC structure 200 further includes a set of gates 220 (FIGS. 2A-2D). The set of gates 220 includes gates 222a, 222b, . . . , 222i. Other configurations or numbers of gates in the set of gates 220 is within the scope of the present disclosure. Each gate of the set of gates 220 extends in the second direction Y, and is separated from each other in the first direction X. The set of gates 220 represent one or more gates 220 of one or more NMOS or PMOS transistor devices. Other transistor types are within the scope of the present disclosure. As shown in FIGS. 2B-2C, the set of gates 220 is over substrate 202. As shown in FIGS. 2A and 2D, gates 222a, 222b, 222c, 222g, 222h and 222i of the set of gates 220 is embedded in substrate 201 or 201'. A portion of gates 222d and 222f of the set of gates 220 are partially embedded in substrate 201 or 201'. The set of gates 220 are over the third set of implants 238. At least an implant of the first set of implants 230 or the second set of implants 236 is between a pair of gates of the set of gates 220. For example, in FIG. 2A, implant 210a1 is between gates 222d and 222e, and implant 210a2 is between gates 222e and 222f. Similarly, in FIG. 2D, implant 208a1 is between gates 222d and 222e, and implant 208a2 is between gates 222e and 222f. As shown in FIG. 2A, gate 222e is between implants 210a1 and 210a2. As shown in FIG. 2D, gate 222e is between implants 208a1 and 208a2. As shown in FIGS. 2B-2C, each of the implants 208b of the third set of implants 238 are between a pair of gates of the set of gates 220. For example, in FIGS. 2B-2C, implant 208b is between gates 222d and 222e. Other configurations of implants of the first set of implants 230, the second set of implants 236 or the third set of implants are within the scope of the present disclosure.

Regions 201a and 201b of substrate 201 of IC structure 200 (FIG. 2A) are manufactured by corresponding layout patterns 106b and 106c of FIGS. 1A-1C. In some embodiments, regions 201a and 201b are portions of the same substrate (e.g., substrate 201) separated from each other by region 212. Regions 201c and 201d of substrate 201' of IC structure 200 (FIG. 2D) are manufactured by corresponding layout patterns 110b and 110c of FIGS. 1A-1C. In some embodiments, regions 201c and 201d are portions of the same substrate (e.g., substrate 201') separated from each other by region 218.

Region 212 corresponds to active region 112 of layout design 100 of FIG. 1C. Region 212 is a tap cell of IC structure 200 and is coupled to the first voltage supply VDD. In other words, region 212 is configured to provide the first voltage supply VDD as the bias voltage (e.g., VDD) to the first portion 204a of the first well 204 by coupling the first voltage supply VDD to the implant region 210a1, 210a2. In some embodiments, region 212 is coupled to the second voltage supply VSS and is configured to provide the second voltage supply VSS as the bias voltage (e.g., VSS) to the first portion 204a of the first well 204. In some embodiments, first region 204a of the first well 204 is positioned within region 212. In some embodiments, the first region 204a of the first well 204 extends in the second direction Y from gate 222d to gate 222f.

Region 218 corresponds to active region 118 of layout design 100 of FIG. 1C. Region 218 is a tap cell of IC structure 200 and is coupled to the second voltage supply VSS. In other words, region 218 is configured to provide the second voltage supply VSS as the bias voltage (e.g., VSS) to the second well 206 by coupling the second voltage supply VSS to the implant region 208a1, 208a2. In some embodiments, region 218 is coupled to the first voltage supply VDD and is configured to provide the first voltage supply VDD as the bias voltage (e.g., VDD) to the second well 206. In some embodiments, the first region 206a of the second well 206 is positioned within region 218. In some embodiments, the first region 206a of the second well 206 extends in the second direction Y from gate 222d to gate 222f.

Figure 3A:
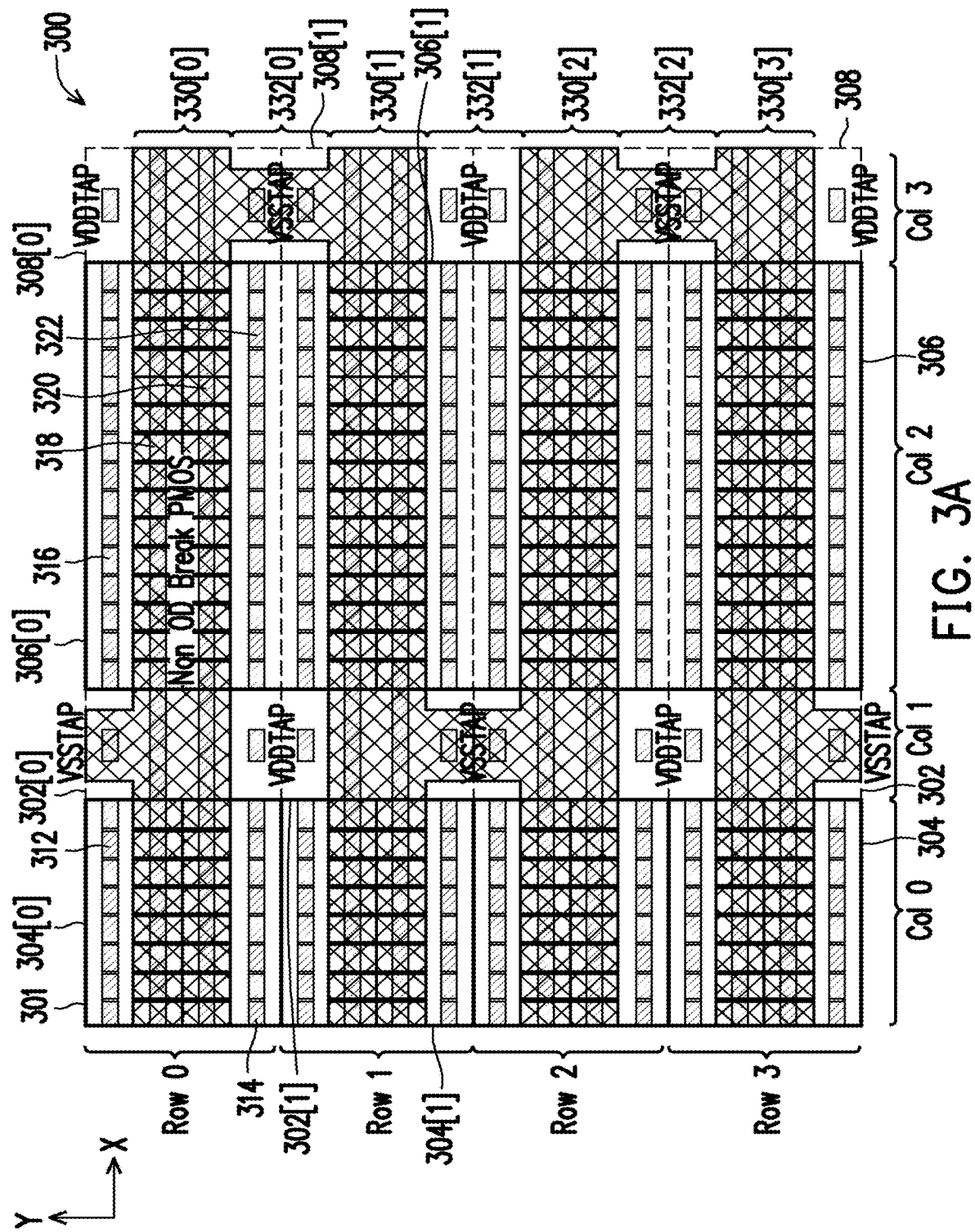
FIGS. 3A-3C are diagrams of a layout design of an IC structure, in accordance with some embodiments.
Figure 3B:
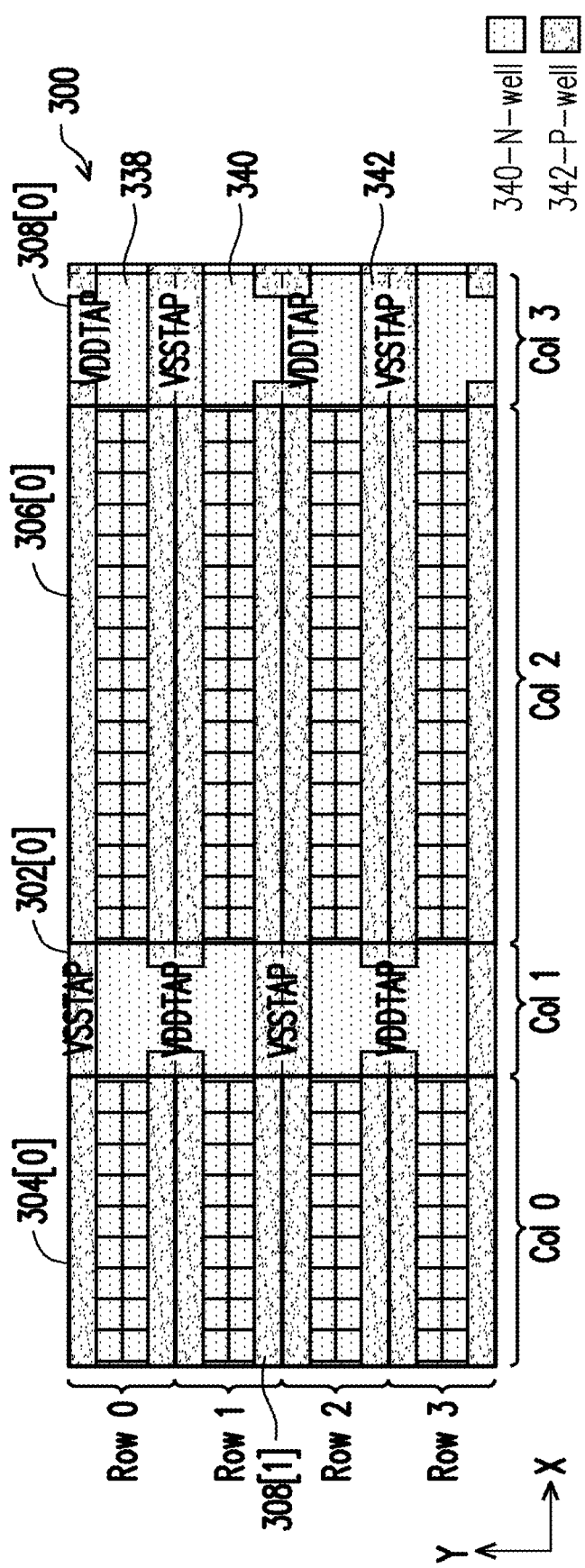
Figure 3C:
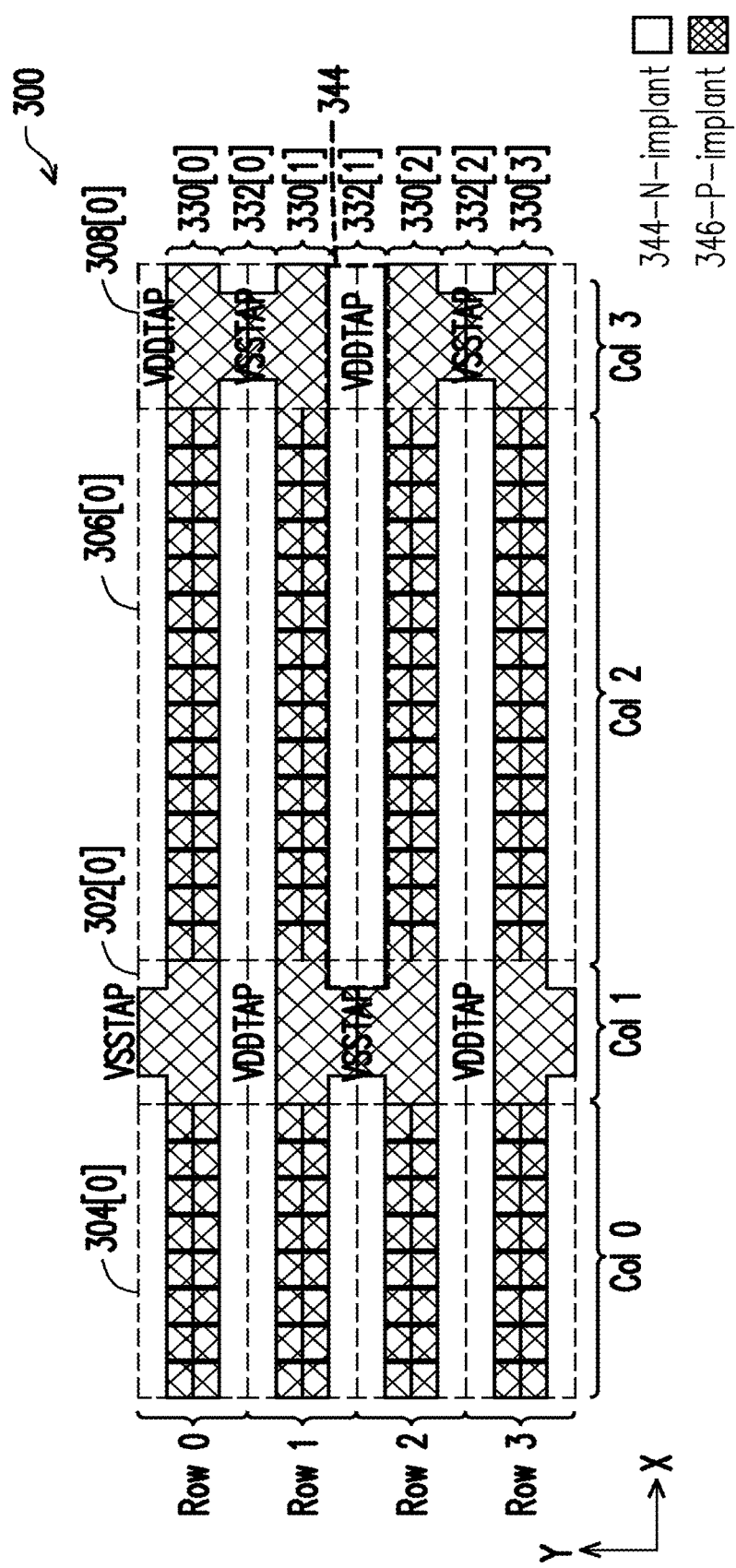

FIGS. 3A-3C are diagrams of a layout design 300 of an IC structure, in accordance with some embodiments. For ease of illustration, FIG. 3B is a top view of a first layout level of layout design 300, and FIG. 3C is a top view of a second layout level of layout design 300. In some embodiments, FIG. 3A includes additional elements not shown in FIG. 3B or 3C for ease of illustration. Components that are the same or similar to those in FIGS. 1A-1C are given the same reference numbers, and detailed description thereof is thus omitted.

Layout design 300 includes an array of cells 301 having 4 rows and 4 columns. The 4 rows of cells are arranged in the first direction X and the 4 columns of cells are arranged in the second direction Y. Four rows and four columns of cells are used for illustration. A different number of rows or columns is within the contemplated scope of the present disclosure.

Each row of array 301 includes tap cells 302 or 308 alternating with a set of standard cells 304 or 306. For example, row 0 of array of cells 301 includes tap cells 302[0] or 308[0] alternating with a set of standard cells 304[0] or 306[0]. Similarly, row 1 of array of cells 301 includes tap cells 302[1] or 308[1] alternating with a set of standard cells 304[1] or 306[1].

Each of the tap cells in tap cells 302 or 308 shown in layout design 300 are the same as layout design 100 and will not be described. For example, tap cells 308[0], 308[1], 302[0] and 302[1] are the same as layout design 100. Tap cells 308[1] and 302[0] are rotated 180 degrees with respect to tap cell layout 308[0] and 302[1].

Set of standard cells 304 or 306 includes one or more standard cells. In some embodiments, a standard cell is a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, clock cells or the like. In some embodiments, a standard cell is a memory cell. In some embodiments, a memory cell includes a static random access memory (SRAM), a dynamic RAM (DRAM), a resistive RAM (RRAM), a magnetoresistive RAM (MRAM), read only memory (ROM), or the like. In some embodiments, a standard cell includes one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, planar MOS transistors with raised source/drain, or the like. Examples of passive elements include, but are not limited to, capacitors, inductors, fuses, resistors, or the like.

Set of standard cells 304[0] includes active regions 312, 314, 318 and 320. Set of standard cells 306[0] includes active regions 316, 318, 320 and 322. Set of standard cells 304 or 306 include other features not shown for ease of illustration.

Active regions 312 or 316 are a variation of active region 118. Active regions 314 or 322 are a variation of active region 112. Active regions 312 and 314 define portions of the active regions of the set of standard cells 304[0]. Active regions 316 and 322 define portions of the active regions of the set of standard cells 306[0].

Active region 318 or 320 corresponds to active region 116 or 114, respectively.

Active regions 312 and 316 are separated by tap cell 302[0]. Similarly, active regions 314 and 322 are separated by tap cell 302[0]. Active regions 312, 314, 316 and 322 do not extend continuously through the layout design 300.

Active regions 318 and 320 in row 0 of implant layout pattern 330[0] extend continuously through the layout design 300. Similarly, the active regions in rows 1, 2 or 3 of corresponding implant layout pattern 330[1], 330[2] or 330[3] extend continuously through the layout design 300.

In some embodiments, active region 318, active region 320, active regions in rows 1, 2 and 3, standard cells 304 or standard cell 306, each have at least one SiGe channel (not labelled). In some embodiments, by continuously extending active region 318, active region 320 or the active regions in rows 1, 2 and 3 through the edges of layout design 300 or through adjacent standard cells 304, 306 causes an increase in the compressive strain of the SiGe channel of layout design 300 compared to other approaches. In some embodiments, by increasing the compressive strain of the SiGe channel of layout design 300, layout design 300 does not have reduced mobility degradation and current degradation like other approaches, resulting in increased driving current capability of a circuit manufactured by layout design 300 and better performance than other approaches. In some embodiments, by having an improved compressive strain of the SiGe channel of layout design 300, layout design 300 can have similar driving current capability as other approaches while occupying less area than the other approaches resulting in an overall reduction in physical size of layout design 300. In some embodiments, SiGe devices having at least one SiGe channel in one or more of active region 318, active region 320, active regions in rows 1, 2 and 3, standard cells 304 or standard cell 306 provides 30% to 50% more current compared to other approaches (e.g., Si channels).

In some embodiments, by continuously extending active region 318, active region 320, or active regions in rows 1, 2 and 3 through the edges of layout design 300 or through adjacent standard cells 304 or standard cell 306, layout design 300 does not have a break in active region 318, active region 320, or active regions in rows 1, 2 and 3 along the edge of tap cells 302 and 308 resulting in less ion degradation along the edge of tap cell 302 and 308 and further resulting in improved driving current capability over other approaches. In other approaches, dummy cells are inserted between cells located along breaks in the active region to reduce the effect of ion degradation thereby causing an increase of the area. In some embodiments, by not having a break in active region 318, active region 320, or active regions in rows 1, 2 and 3, layout design 300 does not utilize dummy cells to overcome ion degradation along the edge of tap cells 302 and 308 and layout design 300 thereby causing a reduction in the size and area of layout design 300 compared to other approaches using inserted dummy cells. Implant layout patterns 330[0], 330[1], 330[2] and 330[3] are the same as second set of implant layout patterns 108. Implant layout patterns 332[0], 332[1], 332[2] and 332[3] are the same as first set of implant layout patterns 110.

Well layout pattern 338 or 340 (FIG. 3B) are the same as first well layout pattern 104. Well layout pattern 338 or 340 extends continuously through the layout design 300 in the first direction X.

Well layout pattern 342 (FIG. 3B) is the same as second well layout pattern 106. Well layout pattern 342 does not extend continuously through the layout design 300 in the first direction X.

Figure 4A:
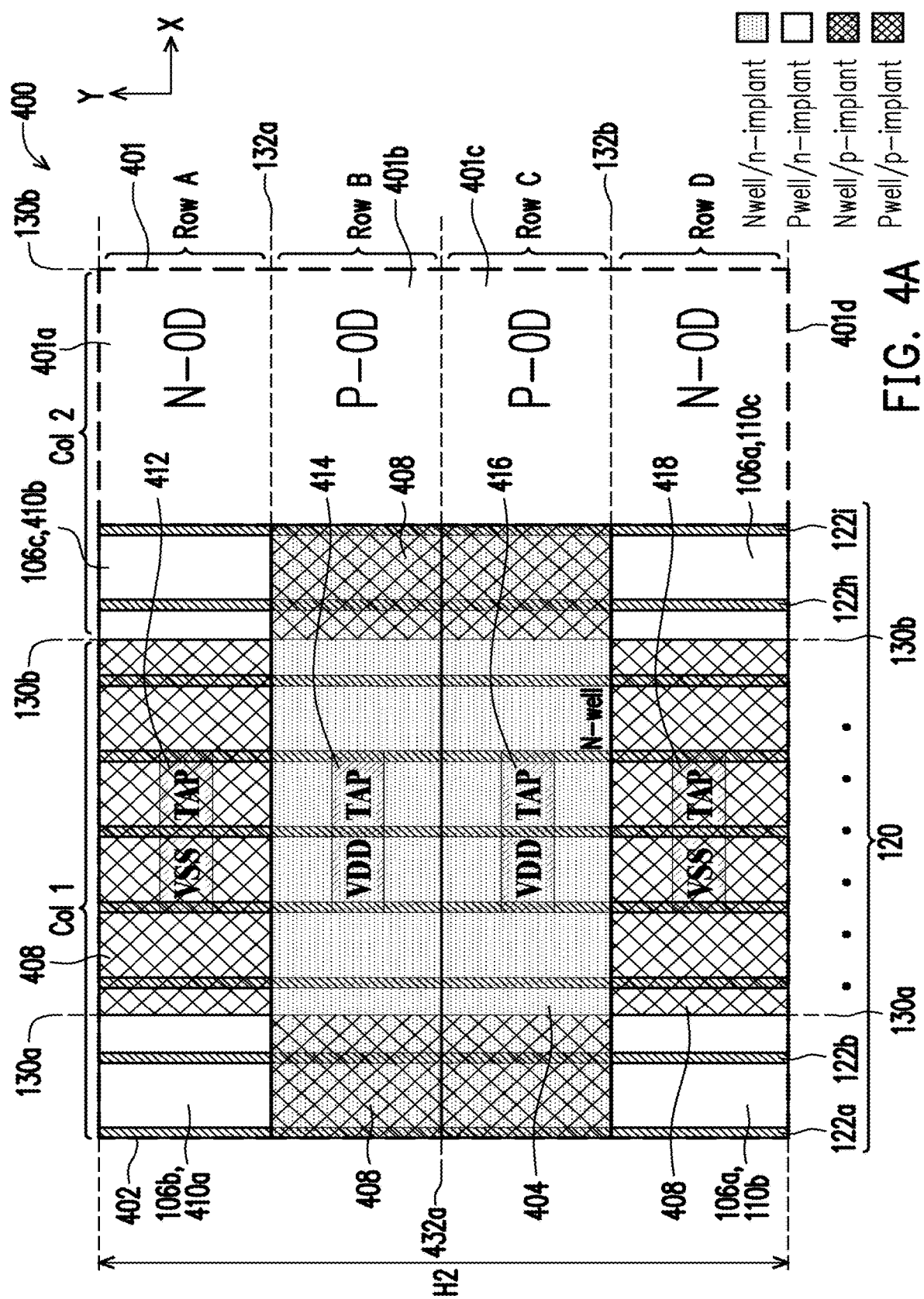

FIGS. 4A-4C are top views of a layout design 400 of an IC structure, in accordance with some embodiments. For ease of illustration, FIG. 4B is a top view of a first layout level of layout design 400, and FIG. 4C is a top view of a second layout level of layout design 400. In some embodiments, FIG. 4A includes additional elements not shown in FIG. 4B or 4C for ease of illustration.

Layout design 400 includes a set of standard cells 401 and a tap cell 402. Layout design 400 is divided into an array having 4 rows (e.g., rows A, B, C and D) and 2 columns (Col. 1 and 2). Four rows and two columns of cells are used for illustration. A different number of rows or columns is within the contemplated scope of the present disclosure. Each of set of standard cells 401 and tap cell 402 are within a separate column (Col. 1 or 2) of the array of layout design 400.

Set of standard cells 401 corresponds to set of standard cells 304[0], 304[1], 306[0] or 306[1] of FIGS. 3A-3C. Tap cell 402 is a variation of layout design 100 of FIGS. 1A-1C. In comparison with layout design 100 of FIG. 1A, implant layout pattern 408 does not extend continuously through tap cell 402. Layout design 400 has a height H2 in the second direction Y. In some embodiments, height H2 of layout design 400 is the same as height H1 of layout design 100 of FIGS. 1A-1C. In some embodiments, height H2 of layout design 400 is different from height H1 of layout design 100 of FIGS. 1A-1C.

Set of standard cells 401 includes cell region 401a, 401b, 401c and 401d. Cell region 401a is in row A of the array, cell region 401b is in row B of the array, cell region 401c is in row C of the array and cell region 401d is in row D of the array. Cell region 401a or 401d includes at least one n-type standard cell. In some embodiments, cell region 401a or 401d includes at least one p-type standard cell. Cell region 401b or 401c includes at least one p-type standard cell. In some embodiments, cell region 401b or 401c includes at least one n-type standard cell.

Tap cell 402 includes a first well layout pattern 404, a second well layout pattern 406, a first set of implant layout patterns 410 and a second set of implant layout patterns 408.

First well layout pattern 404 is a variation of first well layout pattern 104. First well layout pattern 404 does not include a first well layout pattern 104a.

Second well layout pattern 406 is a variation of second well layout pattern 106. In comparison with second well layout pattern 106 of FIGS. 1A-1C, second well layout pattern 406 further includes layout pattern 406d. Layout pattern 406d replaces first well layout pattern 104a of FIGS. 1A-1C. Layout patterns 106b, 106c and 406d extend continuously through the tap cell 402.

First set of implant layout patterns 410 is a variation of first set of implant layout patterns 110. First set of implant layout patterns 410 includes implant layout pattern 108a, implant layout pattern 110b, implant layout pattern 110c, an implant layout pattern 410a, an implant layout pattern 410b and an implant layout pattern 410c.

Implant layout patterns 410a and 410b are a variation of implant layout pattern 110a. Implant layout pattern 110a of FIGS. 1A-1C is divided into implant layout patterns 410a and 410b. Implant layout patterns 410a and 410b are separated from each other by implant layout pattern 408c.

Implant layout pattern 410c is a variation of implant layout pattern 110a, 110b or 110c. Implant layout pattern 410c replaces a center portion of implant layout pattern 108b. Implant layout pattern 410C is located in a center portion of tap cell 402. The center portion of tap cell 402 is between gridlines 130a and 130b in the first direction X, and between gridlines 132a and 132b in the second direction Y.

Second set of implant layout patterns 408 is a variation of second set of implant layout patterns 108. Second set of implant layout patterns 408 includes implant layout pattern 108a, an implant layout pattern 408b, an implant layout pattern 408c, and an implant layout pattern 408d.

Implant layout patterns 408b and 408d are a variation of implant layout pattern 108b. For example, implant layout pattern 408b and implant layout pattern 408d are separated from each other by implant layout pattern 410c.

Implant layout pattern 408c is a variation of implant layout pattern 108a. For example, implant layout pattern 408c and implant layout pattern 108a are separated from each other by implant layout pattern 410c.

Tap cell 402 further includes active regions 412, 414, 416 and 418. Active region 412 or 418 is a variation of active region 118 of FIGS. 1A-1C. Active region 412 is located in row A of the array, and active region 418 is located in row D of the array.

Active region 414 or 416 is a variation of active region 112 of FIGS. 1A-1C. Active region 414 is located in row B of the array, and active region 416 is located in row C of the array.

Figure 5A:
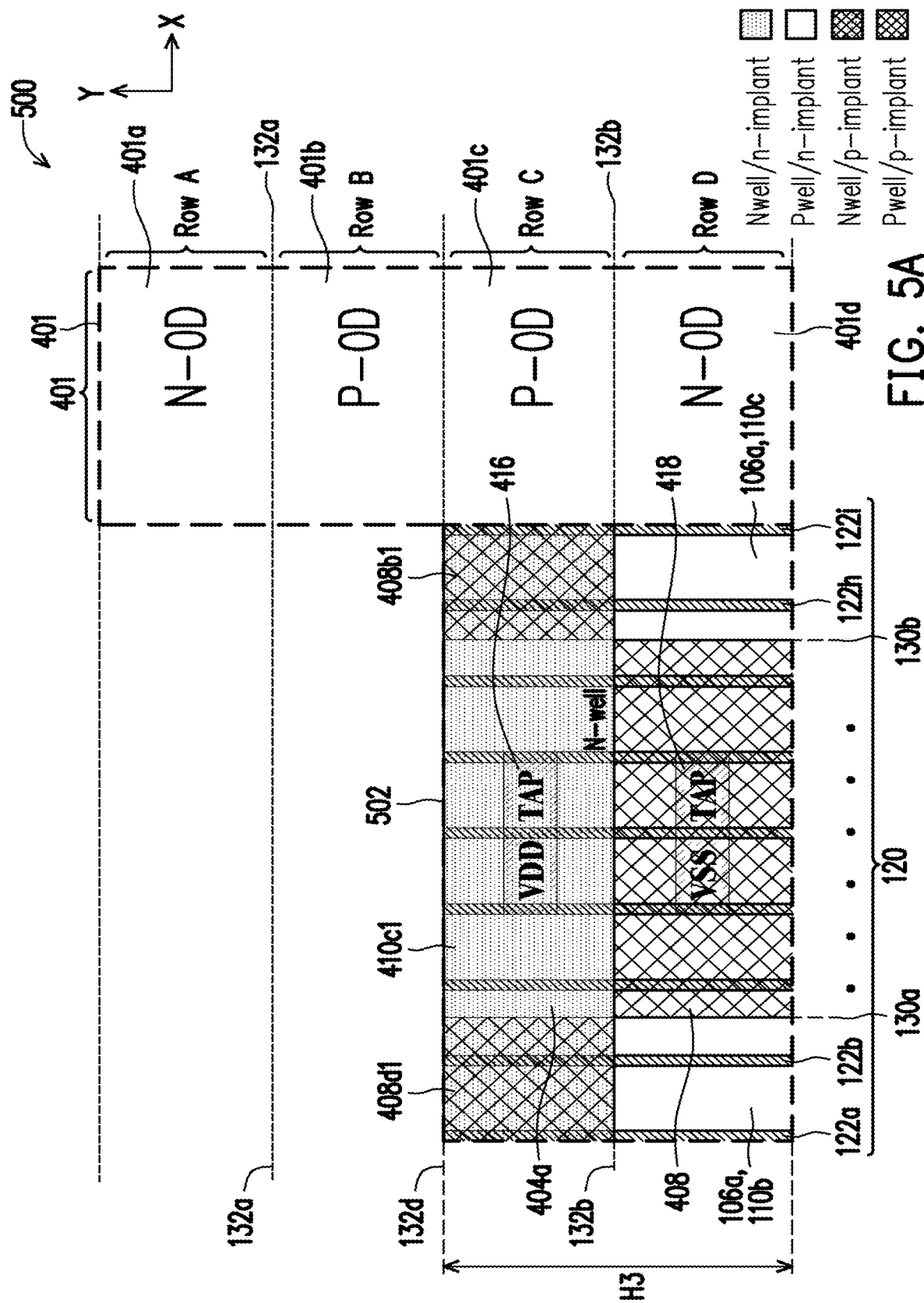
FIG. 5A is a diagram of a top view of a layout design of an IC structure, in accordance with some embodiments.

FIG. 5A is a top view of a layout design 500 of an integrated circuit structure, in accordance with some embodiments.

Layout design 500 is a variation of layout design 400 of FIGS. 4A-4C. In comparison with layout design 400 of FIGS. 4A-4C, layout design 500 includes tap cell 502 instead of tap cell 402. Tap cell 502 is a variation of tap cell 402. Tap cell 502 has a height H3 in the second direction Y. In some embodiments, height H3 of tap cell 502 is one half of the height H2 of tap cell 402 from layout design 400. In some embodiments, height H3 of tap cell 502 is one half of the height H1 of layout design 100 of FIGS. 1A-1C. Other variations of the height H3 of tap cell 502, height H2 of tap cell 402 or height H1 of layout design 100 are included in the scope of the present disclosure.

Tap cell 502 does not include the portion of tap cell 402 in row A and B of the array. For example, tap cell 502 does not include layout patterns 106b, 106c and 406d, implant layout patterns 410a, 410b and 408c, and active region 412 of row A of the array of tap cell 402.

The elements in rows B and C of the array of tap cell 502 are divided along gridline 132d such that tap cell 502 does not include the elements of tap cell 402 between gridlines 132d and 132a. In other words, second well layout pattern 404 and implant layout patterns 408d, 410c, 408b of FIGS. 4A-4C are divided along gridline 132d such that the portion of these elements in row B of the array are not included in tap cell 502, and the portion of these elements in row C of the array are included in tap cell 502. For example, first well layout pattern 404a of Row C of tap cell 502 is first well layout pattern 404 of tap cell 402 positioned in a single row. Similarly, implant layout pattern 408d1 of Row C of tap cell 502 is implant layout pattern 408d of tap cell 402 positioned in a single row. Similarly, implant layout pattern 408b1 of Row C of tap cell 502 is implant layout pattern 408b of tap cell 402 positioned in a single row, and implant layout pattern 410c1 of Row C of tap cell 502 is implant layout pattern 410c of tap cell 402 positioned in a single row. Tap cell 502 also does not include active region 414.

Figure 5B:
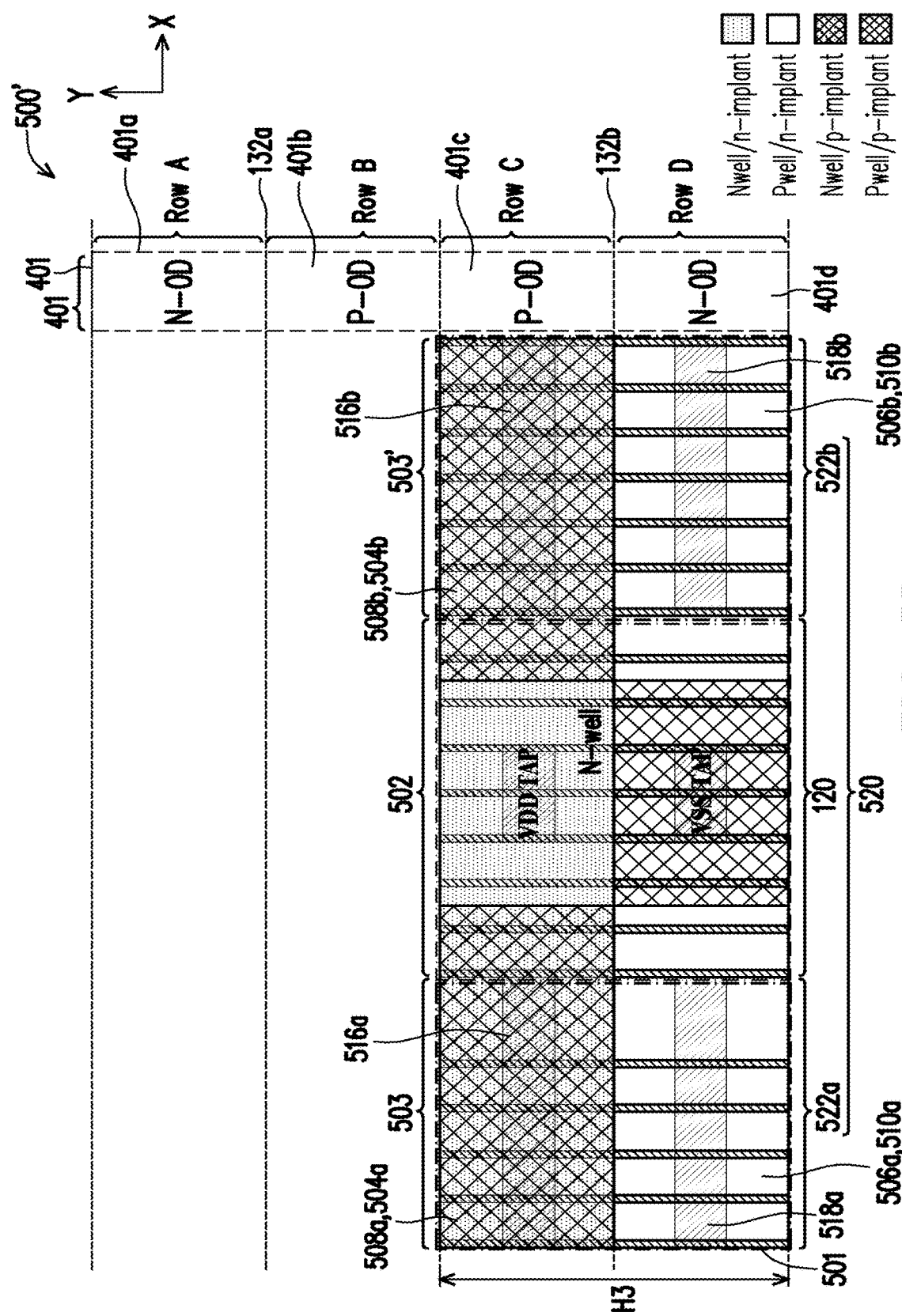
FIG. 5B is a diagram of a top view of a layout design of an IC structure, in accordance with some embodiments.

FIG. 5B is a top view of a layout design 500' of an IC structure, in accordance with some embodiments.

Layout design 500' is a variation of layout design 500 of FIG. 5A. In comparison with layout design 500 of FIG. 5A, layout design 500' further includes tap portion 503 and tap portion 503'. Tap cell 502 is located between tap portion 503 and tap portion 503'. Tap cell 502, tap portion 503 and tap portion 503' correspond to a tap cell 501. In other words, tap cell 501 includes tap cell 502, tap portion 503 and tap portion 503'.

Tap portion 503 includes a first well layout pattern 504a, a second well layout pattern 506a, an implant layout pattern 508a, an implant layout pattern 510a, an active region 516a, an active region 518a, and a set of gate layout patterns 522a.

First well layout pattern 504a is a variation of the second layout pattern 104b of well layout pattern 104 (FIG. 1A). First well layout pattern 504a corresponds to first well layout pattern 404a extended in a third direction −X (e.g., a negative X direction).

Second well layout pattern 506a is a variation of layout pattern 106a (FIG. 1A) of well layout pattern 106. Second well layout pattern 506a corresponds to layout pattern 106a (FIG. 1A) extended in the third direction −X (e.g., negative X direction). In some embodiments, the third direction −X (e.g., negative X direction) is a direction opposite from the first direction X.

Implant layout pattern 508a is a variation of implant layout pattern 108b (FIG. 1B) of second set of implant layout pattern 106. Implant layout pattern 508a corresponds to implant layout pattern 108b (FIG. 1B) extended in the third direction −X (e.g., negative X direction).

Implant layout pattern 510a is a variation of implant layout pattern 110b (FIG. 1B) of first set of implant layout patterns 110. Implant layout pattern 510a corresponds to implant layout pattern 110b (FIG. 1B) extended in the third direction −X (e.g., negative X direction).

Active regions 516a and 518a are variations of active regions 416 and 418, respectively. Active regions 516a and 518a correspond to active regions 416 and 418, respectively, positioned in tap portion 503 and extending from an edge of tap cell 502 to an edge of tap portion 503.

Set of gate layout patterns 522a are a variation of set of gate layout patterns 120. Set of gate layout patterns 522a extend in the second direction Y, and overlap tap portion 503.

Tap portion 503' is between tap cell 502 and set of standard cells 401. Tap portion 503' includes a well layout pattern 504b, a well layout pattern 506b, an implant layout pattern 508b, an implant layout pattern 510b, an active region 516b, an active region 518b, and a set of gate layout patterns 522b.

First well layout pattern 504b is a variation of the second layout pattern 104b (FIG. 1A) of well layout pattern 104. First well layout pattern 504b corresponds to first well layout pattern 404a extended in the first direction X.

Second well layout pattern 506b is a variation of layout pattern 106a (FIG. 1A) of well layout pattern 106. Second well layout pattern 506b corresponds to layout pattern 106a (FIG. 1A) extended in the first direction X.

Implant layout patterns 508b and 510b are variations of corresponding implant layout pattern 108b (FIG. 1B) of second set of implant layout pattern 106 and implant layout pattern 110c (FIG. 1B) of first set of implant layout patterns 110. Implant layout pattern 508b corresponds to implant layout pattern 108b (FIG. 1B) extended in the first direction X. Implant layout pattern 510b corresponds to implant layout pattern 110c (FIG. 1B) extended in the first direction X.

Active regions 516b and 518b are variations of corresponding active regions 416 and 418. Active region 516b corresponds to active region 416 positioned in tap portion 503' and extending from an edge of tap cell 502 to an edge of tap portion 503 or an edge of set of standard cells 401. Active region 518b corresponds to active region 418 positioned in tap portion 503' and extending from an edge of tap cell 502 to an edge of tap portion 503' or an edge of set of standard cells 401.

Set of gate layout patterns 522b are a variation of set of gate layout patterns 120. Set of gate layout patterns 522b extend in the second direction, and overlap tap portion 503'.

Figure 6:
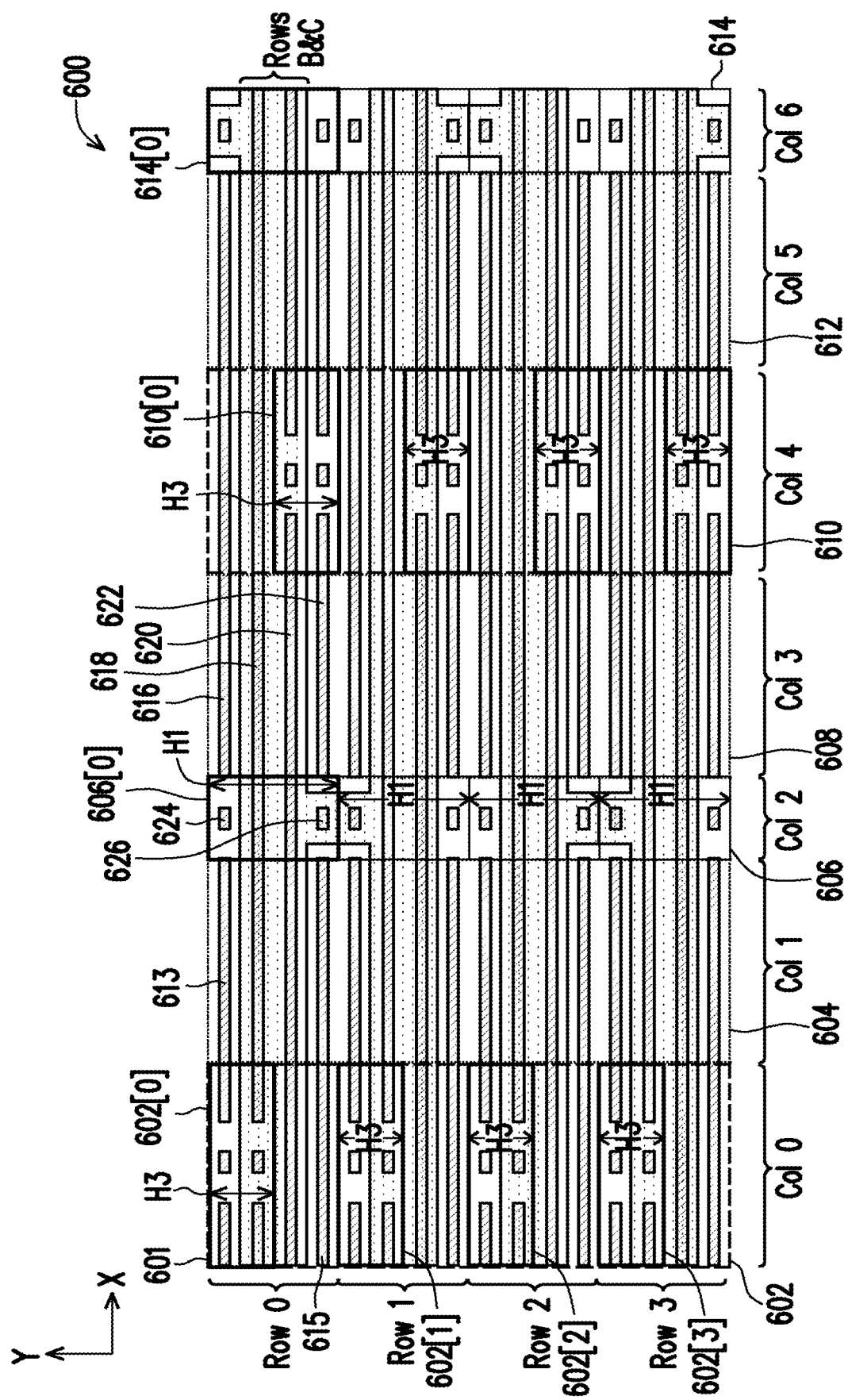
FIG. 6 is a diagram of a top view of a layout design of an IC structure, in accordance with some embodiments.

FIG. 6 is a top view of a layout design 600 of an IC structure, in accordance with some embodiments.

Layout design 600 is a variation of layout design 300. In comparison with layout design 300 of FIGS. 3A-3C, layout design 600 includes an array of cells 601 having 4 rows (e.g., Rows 0, 1, 2 and 3) and 7 columns (e.g., Col. 0, 1, 2, 3, 4, 5, 6). The 4 rows of cells are arranged in the first direction X and the 7 columns of cells are arranged in the second direction Y. Four rows and seven columns of cells are used for illustration. A different number of rows or columns is within the contemplated scope of the present disclosure.

Array of cells 601 includes tap cells 602, 606, 610 and 614, and set of standard cells 604, 608 and 612. Tap cell 602, 606, 610 or 614 includes a corresponding tap cell 602[0], 606[0], 610[0] or 614[0] in row 0 of array of cells 601. Tap cell 602, 606, 610 or 614 or set of standard cells 604, 608 or 612 include other features not shown for ease of illustration.

Tap cell 606 corresponds to column 3 of layout design 300 and tap cell 614 corresponds to column 1 of layout design 300. One or more tap cells in tap cell 606 or 614 corresponds to layout design 100. For example, tap cell 606[0] or 614[0] corresponds to tap cell 100 of FIGS. 1A-1C. For ease of illustration, each of the tap cells in FIG. 6 are not labelled. For example, the tap cell in row 0 of (e.g., tap cell 606[0]) is labelled, but tap cell 606 includes tap cells in rows 1, 2 and 3 that are not labelled for ease of illustration. Similarly, the tap cell in row 0 of (e.g., tap cell 614[0]) is labelled, but tap cell 614 includes tap cells in rows 1, 2 and 3 that are not labelled for ease of illustration. Other variations of tap cells 602 or 610 are included in the scope of the present disclosure. One or more tap cells in tap cells 602 or 610 corresponds to layout design 500' (FIG. 5B). For example, tap cell 602[0] or 610[0] corresponds to tap cell 501 of FIG. 5B. Similarly, one or more of tap cells 602[1], 602[2], 602[3] or 602[4] corresponds to tap cell 501 of FIG. 5B. For ease of illustration, the tap cell in row 0 of (e.g., tap cell 610[0]) is labelled, but tap cell 610 includes tap cells in rows 1, 2 and 3 that are not labelled for ease of illustration. In some embodiments, one or more tap cells in tap cell 602 or 610 corresponds to layout design 400 of FIGS. 4A-4C or layout design 500 of FIG. 5A. Other variations of tap cells 602 or 610 are included in the scope of the present disclosure. Set of standard cells 608 or 612 corresponds to column 2 of layout design 300 (FIGS. 3A-3C). In some embodiments, set of standard cell 604 corresponds to column 0 of the set of standard cells 304 in FIGS. 3A-3C. In some embodiments, one or more of set of standard cells 604, 608 or 612 corresponds to the set of standard cells 401 in FIGS. 5A-5B. Other variations of standard cells 604, 608 or 612 are included in the scope of the present disclosure.

Each row of array 601 includes tap cell 602, 606, 610 or 614 alternating with a set of standard cells 604, 608 or 612. For example, row 0 of array of cells 601 includes tap cell 602[0], 606[0], 610[0] or 614[0] alternating with the set of standard cells 604, 608 or 612.

Tap cell 602, 606, 610 or 614 is located in corresponding column 0, 2, 4 or 6 in array of cells 601. Standard cell 604, 608 or 612 is located in corresponding column 1, 3 or 5 in array of cells 601.

Each of the tap cells in tap cells 602 or 610 shown in layout design 600 are the same as tap cell 501 (FIG. 5B). Tap cells 602[0] and 610[0] are rotated 180 degrees with respect to each other.

Each of the tap cells in tap cells 606 or 614 shown in layout design 600 corresponds to layout design 100 (FIGS. 1A-1C). For example, tap cells 606[0] and 614[0] corresponds to layout design 100. Tap cells 606[0] and 614[0] are rotated 180 degrees with respect to each other.

Row 0 of array of cells 601 includes active regions 613, 615, 616, 618, 620, 622, 624 and 626.

Active region 616, 618, 620 or 622 is a variation of corresponding active region 312, 314, 316 and 318 (FIGS. 3A-3C). Active region 624 or 626 corresponds to active region 118 or 112 in layout design 100 (FIGS. 1A-1C), respectively.

Active region 613 and 616 are separated by active region 624 of tap cell 606[0]. Active region 615 and 622 are separated by active region 626 of tap cell 606[0]. Active regions 613, 615, 616, 622, 624 and 626 do not extend continuously through one or more of the tap cells 602, 606, 610 or 614 in layout design 600.

Active regions 618 and 620 in row 0 extend continuously through tap cell 606[0] in layout design 600. Similarly, the active regions in rows B and C of row 0 extend continuously through tap cell 614[0] of layout design 600. Rows B and C of layout design 600 correspond to implant layout pattern 330[0] (FIGS. 3A-3C). The active regions in rows 1, 2 or 3 extend continuously through the corresponding tap cell in tap cell 606 or 614.

Figure 7:
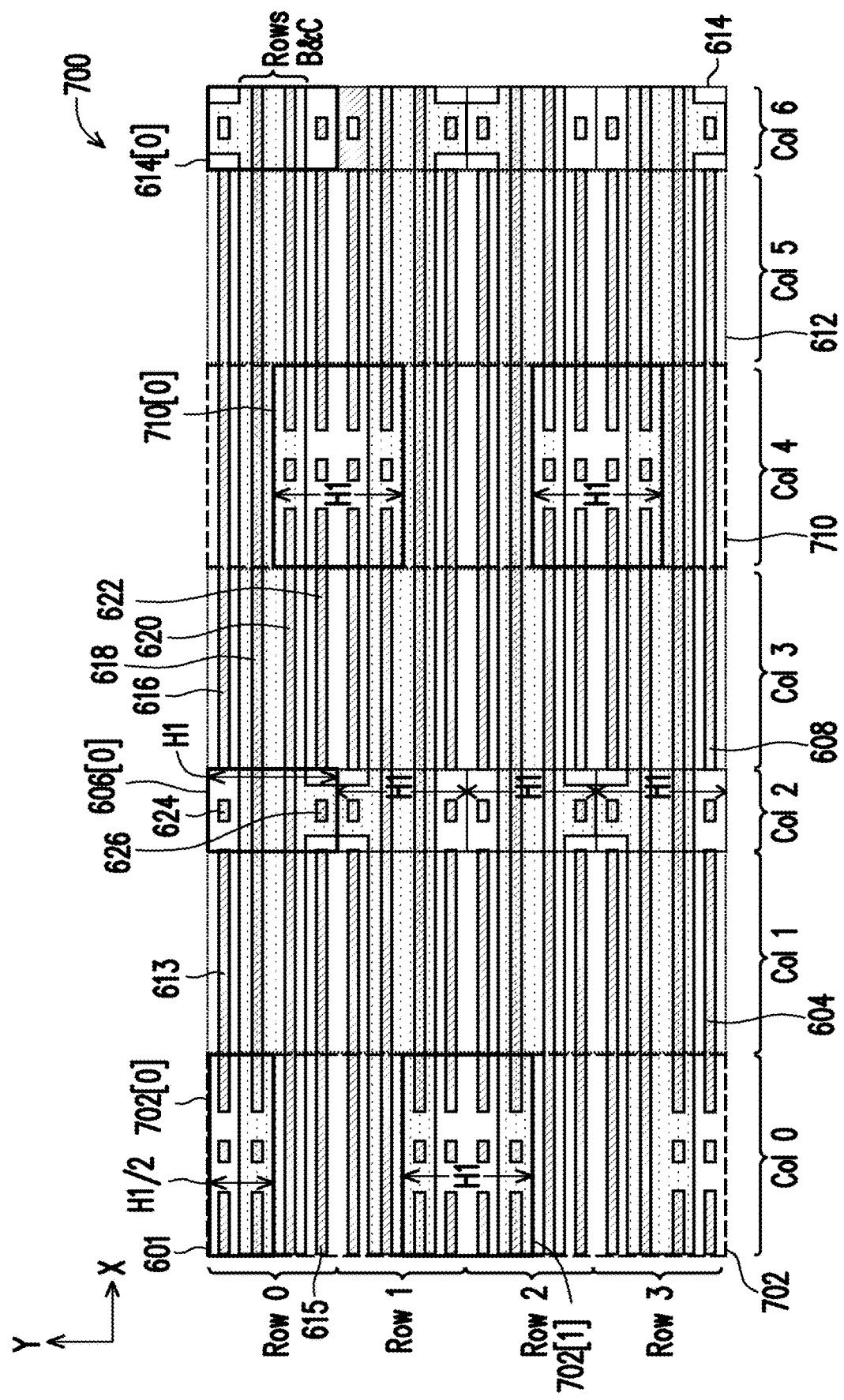
FIG. 7 is a diagram of a top view of a layout design of an IC structure, in accordance with some embodiments.

FIG. 7 is a diagram of a top view of a layout design 700 of an IC structure, in accordance with some embodiments. Layout design 700 is a variation of layout design 600. In comparison with layout design 600 of FIG. 6, layout design 700 replaces tap cell 602 with tap cell 702, and replaces tap cell 610 with tap cell 710.

Tap cell 702 or 710 is a variation of corresponding tap cell 602 or 610 of FIG. 6. At least one tap cell of tap cell 702 or 710 has a height H1 that is different from a height H3 of at least one tap cell in tap cells 602 or 610.

Tap cell 702 includes tap cell 702[0] and 702[1]. In some embodiments, tap cell 702[0] has a height H1/2 that is equal to height H3 of tap cell 602[1]. Tap cell 702[1] has a height H1 that is twice as large as a height H3 of tap cell 602[1].

Tap cell 710 includes tap cell 710[0]. Tap cell 710[0] has a height H1 that is twice as large as a height H3 of tap cell 610[0]. A different relationship between the heights (e.g., H1 and H3) of tap cell 702[0], 702[1], 710[0], 602[0] and 610[0] is within the contemplated scope of the present disclosure.

In some embodiments, active region 618, active region 620, active regions in rows 0, 1, 2 and 3, standard cells 604, standard cell 608 or standard cell 612, each have at least one SiGe channel (not labelled). In some embodiments, by continuously extending active region 618, active region 620 or the active regions in rows 1, 2 and 3 through tap cells 606 and 614 or through adjacent standard cells 604, 608 or 612, causes an increase in the compressive strain of the SiGe channels of layout design 600 or 700 compared to other approaches. In some embodiments, by increasing the compressive strain of the SiGe channels of layout design 600 or 700, layout design 600 or 700 does not have reduced mobility degradation and current degradation like other approaches, yielding increased driving current capability of a circuit manufactured by layout design 600 or 700 and better performance than other approaches. In some embodiments, by having an improved compressive strain of the SiGe channels of layout design 600 or 700, layout design 600 or 700 can have similar driving current capability as other approaches while occupying less area than the other approaches resulting in an overall reduction in physical size of layout design 600 or 700. In some embodiments, SiGe devices having at least one SiGe channel in one or more of active region 618, active region 620, active regions in rows 0, 1, 2 and 3, standard cells 604, standard cell 608 or standard cell 612 provides 30% to 50% more current compared to other approaches (e.g., Si channels).

In some embodiments, by continuously extending active region 618, active region 620 or active regions in rows 0, 1, 2 and 3 through tap cells 606 and 614 or through adjacent standard cells 604, standard cell 608 or standard cell 612, layout design 600 or 700 does not have a break in active region 618, active region 620 or active regions in rows 0, 1, 2 and 3 in tap cell 606, tap cell 614 or standard cells 604, 608 or 612 resulting in less ion degradation along the edge or interface of tap cells 606 and 614 or standard cells 604, 608 or 612 and further resulting in improved driving current capability over other approaches. In other approaches, dummy cells are inserted between cells located along breaks in the active region to reduce the effect of ion degradation thereby causing an increase of the area. In some embodiments, by not having a break in active region 618, active region 620, active regions in rows 0, 1, 2 and 3 along the edge or interface of tap cells 606 and 614 and standard cells 604, 608 or 612, layout design 600 or 700 does not utilize dummy cells to overcome ion degradation along the edge of tap cells 606 and 614 and layout design 600 or 700 thereby causing a reduction in the size and area of layout design 600 or 700 compared to other approaches using inserted dummy cells.

Figure 8:
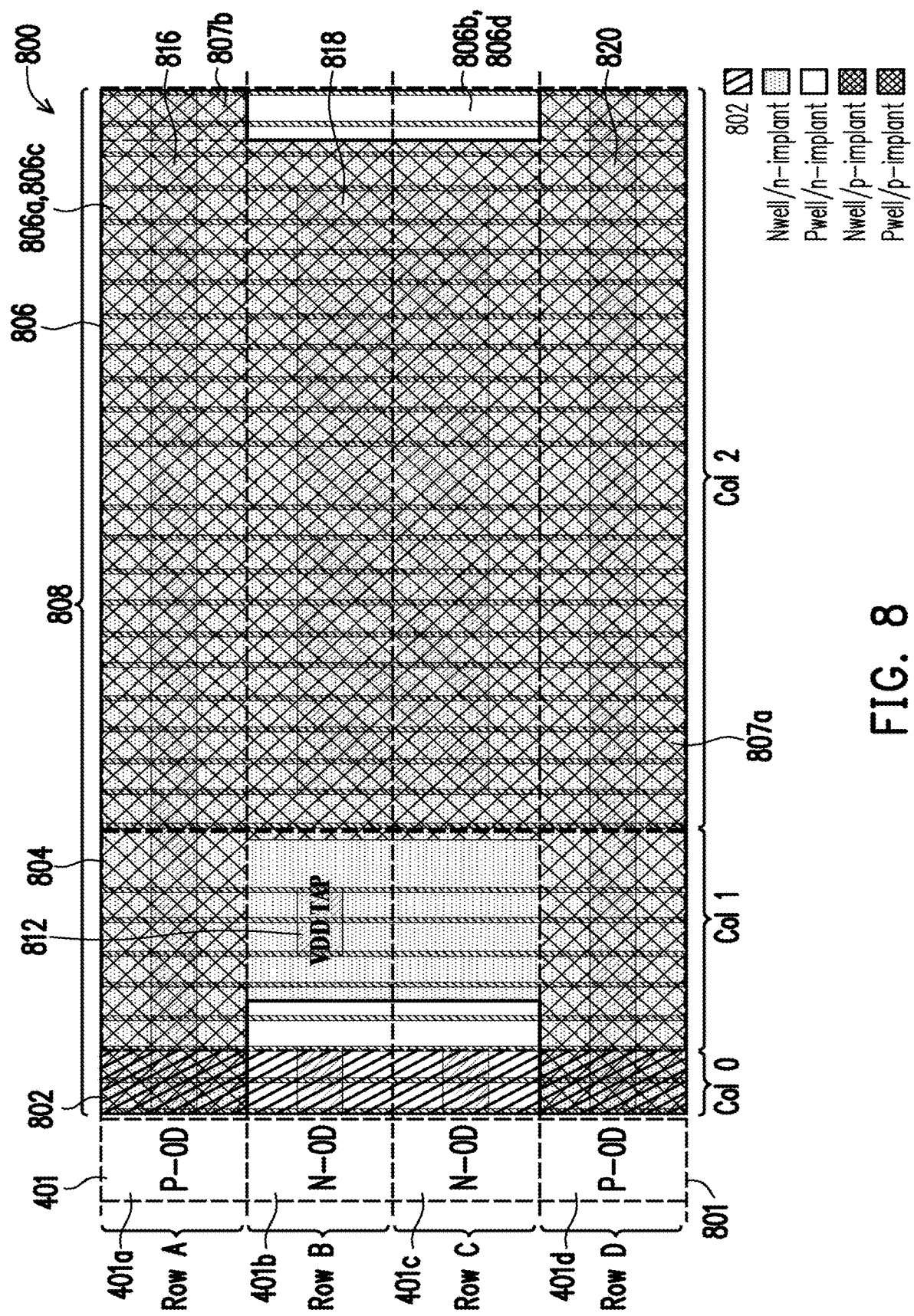
FIG. 8 is a diagram of a top view of a layout design of an IC structure, in accordance with some embodiments.

FIG. 8 is a top view of a layout design 800 of an IC structure, in accordance with some embodiments. Layout design 800 is a variation of layout design 600 or 700.

Layout design 800 is an array of cells 801 having 4 rows (Rows A, B, C and D) and 3 columns (Cols. 0, 1 and 2). The 4 rows of cells are arranged in the first direction X and the 3 columns of cells are arranged in the second direction Y. Four rows and three columns of cells are used for illustration. A different number of rows or columns is within the contemplated scope of the present disclosure.

Layout design 800 includes a control circuit layout pattern 802 between a tap cell 804 and the set of standard cells 401. Layout design 800 further includes a header cell layout pattern 806 adjacent to the tap cell 804, and a set of gate layout patterns 808 extending in the second direction Y. Set of gate layout patterns 808 overlap control circuit layout pattern 802, tap cell 804 and header cell layout pattern 806.

Control circuit layout pattern 802 is adjacent to the set of standard cells 401. Control circuit layout pattern 802 is usable to manufacture a control circuit (not shown) in substrate 201, 201' or 202 of IC structure 200. Control circuit layout pattern 802 is in column 0 of array of cells 801. Control circuit layout pattern 802 extends across rows A-D in the array of cells 801. In some embodiments, the control circuit (not shown) manufactured by control circuit layout pattern 802 is a buffer circuit configured to control the switching on or off of a header cell (e.g., header cell manufactured by header cell layout pattern 806). In some embodiments, the buffer circuit (not shown) includes a series of cascaded buffers (not shown) or an even number of inverters (not shown) coupled in series.

Tap cell 804 is a variation of tap cell 302 or 308 (shown in FIGS. 3A-3C) or layout design 100 of FIGS. 1A-1C. Tap cell 804 includes a portion of layout design 100. For example, row A and B of tap cell 804 corresponds to the portion of layout design 100 between gridline 132*c* and gridline 132*d*. Tap cell 804 includes an active region 812. Active region 812 corresponds to active region 112 of FIGS. 1A-1C.

Header cell layout pattern 806 extends in the first direction X. Header cell layout pattern 806 includes a well layout pattern 806*a*, a well layout pattern 806*b*, implant layout pattern 806*c* and implant layout pattern 806*d*. Header cell layout pattern 806 is usable to manufacture one or more header cells (not shown) in substrate 201, 201' or 202 of IC structure 200. In some embodiments, a header cell (not shown) is a switch device, a transistor device, or the like. In some embodiments, a header cell is one or more p-type, n-type transistor devices, or the like. A header cell is configured to have a voltage drop across its terminals which adjusts the voltage provided to one or more standard cells.

Well layout pattern 806*a* corresponds to second layout pattern 104*b* (FIGS. 1A-1C). Well layout pattern 806*a* is located in rows A-D for a first portion 807*a* of header cell layout pattern 806. Well layout pattern 806*a* is located in rows A and D for a second portion 807*b* of header cell layout pattern 806.

Well layout patterns 806*a* and 806*b* extend in the first direction X. Well layout pattern 806*b* corresponds to layout pattern 106*a* (FIGS. 1A-1C). Well layout pattern 806*b* is located in rows B and C of layout design 800. In some embodiments, well layout pattern 806*b* is located along an edge of header cell layout pattern 806. Well layout pattern 806*b* is adjacent to well layout pattern 806*a*.

Implant layout pattern 806*c* corresponds to implant layout pattern 108*b* (FIGS. 1A-1C). Implant layout pattern 806*c* is adjacent to implant layout pattern 806*d*. Implant layout pattern 806*c* extends in the first direction X, and is over the well layout pattern 806*a*.

Implant layout pattern 806*d* corresponds to implant layout pattern 110*b* or 110*c* (FIGS. 1A-1C). Implant layout pattern 806*d* extends in the first direction X or the second direction Y, and is over the well layout pattern 806*b*.

Active region 816 or 820 is located in corresponding row A or D in array of cells 801. Active region 818 is located in rows B and C in array of cells 801. Active region 816, 818 or 820 corresponds to active region 114, 116 (FIGS. 1A-1C) or active region 318 or 320 (FIGS. 3A-3C).

Active regions 816 and 820 in corresponding rows A and D extend continuously through tap cell 804, control circuit layout pattern 802 or header cell layout pattern 806 in layout design 800. Similarly, active region 818 in rows B and C extends continuously through header cell layout pattern 806. In some embodiments, the active region 816 or active region 820 of header cell 806 each have at least one SiGe channel (not labelled). In some embodiments, by continuously extending active region 816 or active region 820 through the edges of layout design 800 or through adjacent standard cells 401*a*, 401*b*, causes an increase in the compressive strain of each of the SiGe channels of header cell 806 and layout design 800 compared to other approaches. In some embodiments, by increasing the compressive strain of the SiGe channels of header cell 806 and layout design 800, the driving current capability of a circuit manufactured by layout design 800 is increased resulting in better performance than other approaches. In some embodiments, by having an improved compressive strain of the SiGe channel of header cell 806 and layout design 800, layout design 800 can have similar driving current capability as other approaches while occupying less area than the other approaches resulting in an overall reduction in physical size of layout design 800. In some embodiments, the at least one SiGe channel of header cell 806 in active region 816 or 820 provides at least 5% more current compared to other approaches (e.g., Si channels). In some embodiments, by continuously extending active region 816 or active region 820 through the edges of layout design 800 or through adjacent standard cells 401*a*, 401*b*, header cell 806 and layout design 800 do not have a break in active region 816 and active region 820 along the edge of header cell 806 and layout design 800 resulting in less ion degradation along the edge of header cell 806 and layout design 800 and further resulting in improved driving current capability over other approaches. In other approaches, dummy cells are inserted between cells located along breaks in the active region to reduce the effect of ion degradation thereby causing an increase of the area. In some embodiments, by not having a break in the active region 816 and active region 820, layout design 800 does not utilize dummy cells to overcome ion degradation along the edge of header cell 806 and layout design 800 thereby causing a reduction in the size and area of layout design 800 compared to other approaches using inserted dummy cells.

Set of gate layout patterns 808 extend in the second direction Y. Set of gate layout patterns 808 overlap control circuit layout pattern 802, tap cell 804 or header cell layout pattern 806. Set of gate layout patterns 808 corresponds to a variation of set of gate layout patterns 120, 522*a* or 522*b*. In some embodiments, set of gate layout patterns 808 is on the third layout level of layout design 800. Other configurations or numbers of gate layout patterns in the set of gate layout patterns 808 is within the scope of the present disclosure.

Figure 9:
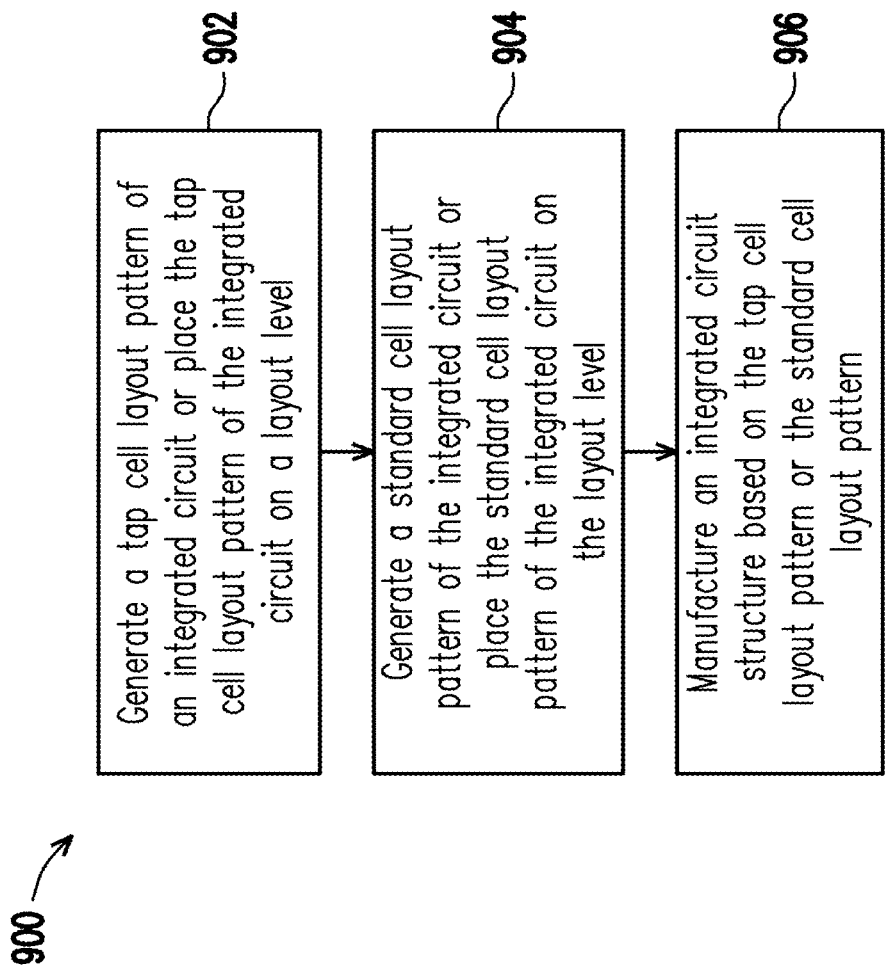
FIG. 9 is a flowchart of a method of forming an IC structure, in accordance with some embodiments.

FIG. 9 is a flowchart of a method 900 of forming an IC structure in accordance with some embodiments. It is understood that additional operations may be performed before, during, and/or after the method 900 depicted in FIG. 9, and that some other processes may only be briefly described herein. In some embodiments, the method 900 is usable to form integrated circuits, such as IC structure 200 (FIGS. 2A-2D), other IC structures or the like.

In operation 902 of method 900, a tap cell layout design 100 of an integrated circuit 200 is generated or the tap cell layout design 100 of the integrated circuit is placed on a layout level. In some embodiments, the layout level is located above a substrate layout pattern. In some embodiments, the tap cell layout pattern generated by operation 902 is tap cell layout pattern 302, 308, 402, 501, 502, 602, 606, 610, 614, 702, 710 or 804.

In operation 904, a standard cell layout pattern 306[1] of the integrated circuit 200 is generated or the standard cell layout pattern 306[1] of the integrated circuit is placed on the layout level. In some embodiments, the standard cell layout pattern generated by operation 904 is standard cell layout pattern 304, 306, 401, 604, 608 or 612 or header cell layout pattern 806.

In operation 906, an IC structure 200 is manufactured based on the tap cell layout design 100 or the standard cell layout pattern 306[1].

Figure 10A:
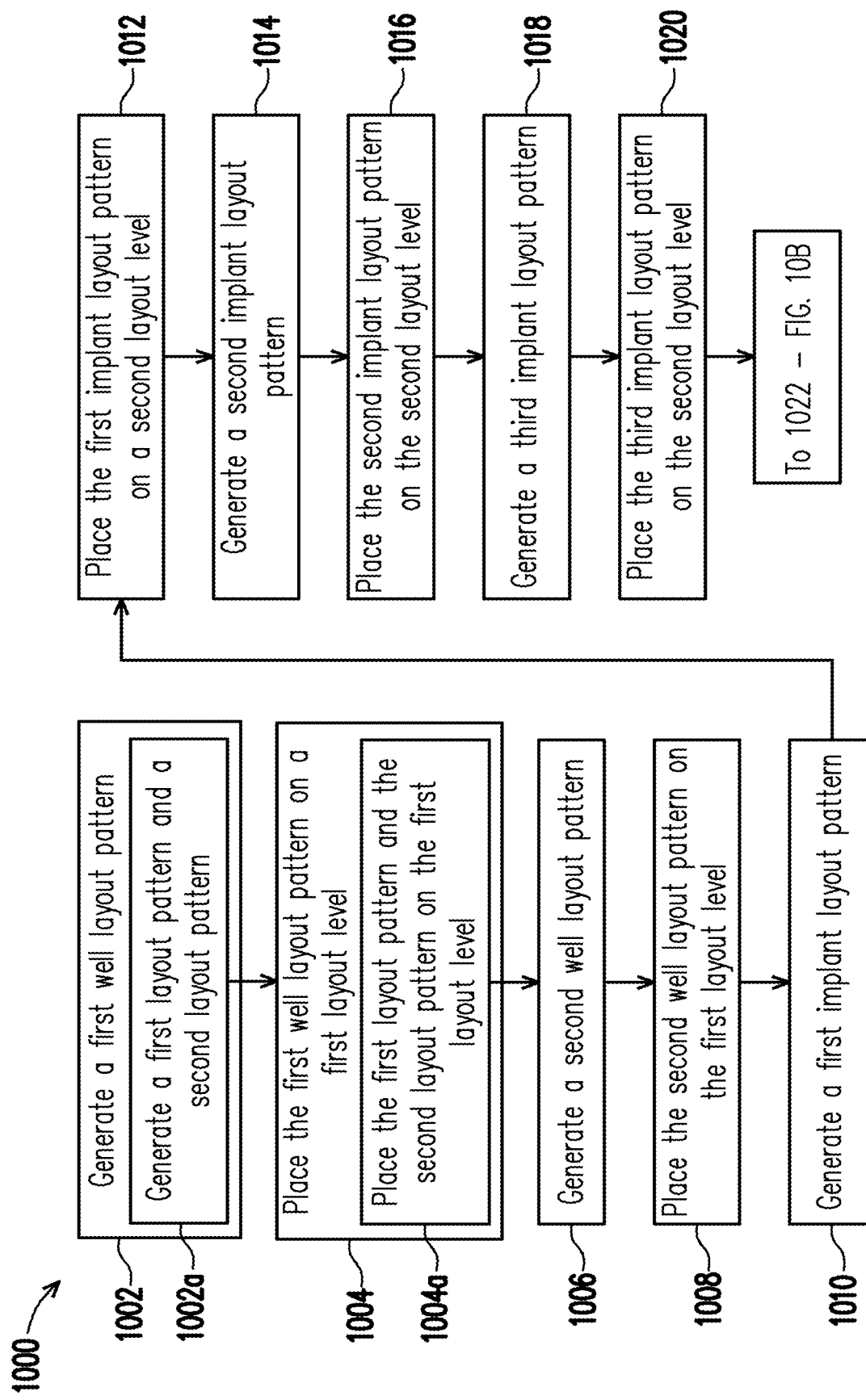
FIG. 10A-10B is a flowchart of a method of forming an IC structure, in accordance with some embodiments.
Figure 10B:
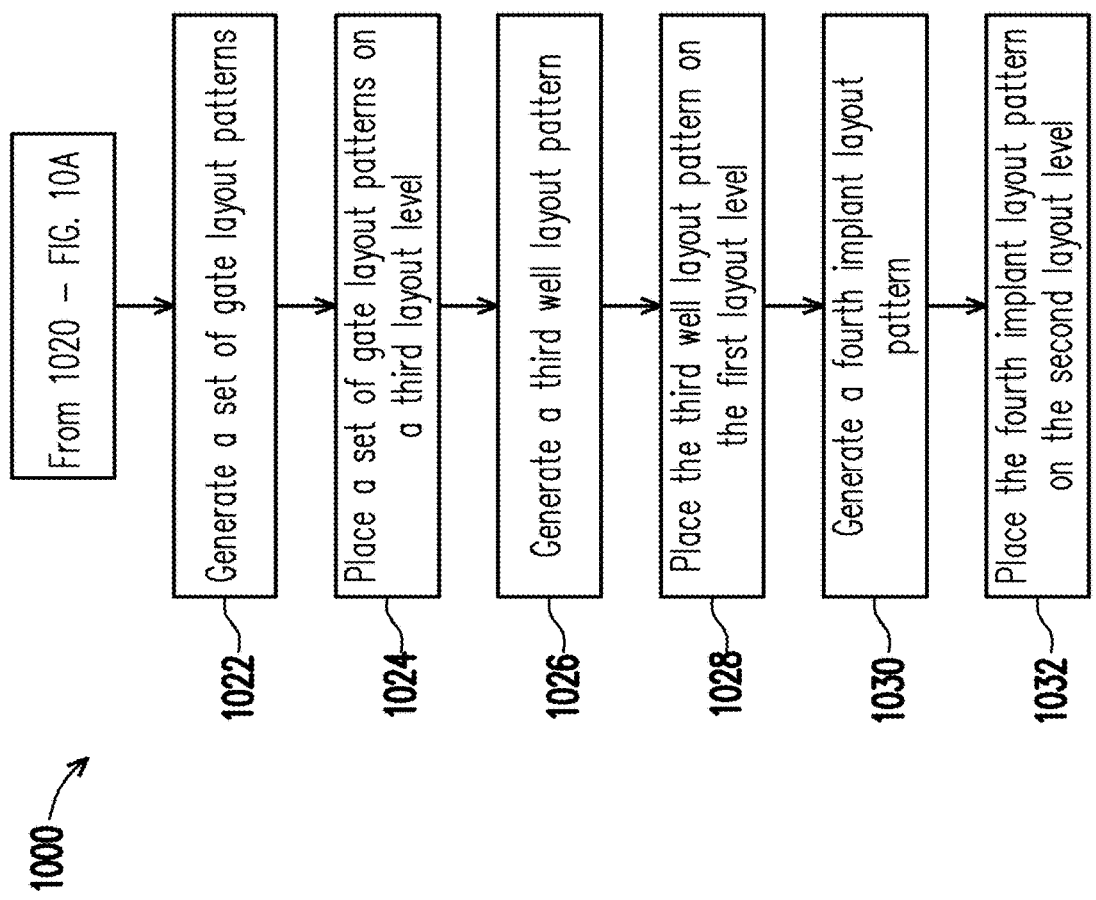

FIGS. 10A-10B are a flowchart of a method 1000 of manufacturing an IC in accordance with some embodiments. It is understood that additional operations may be performed before, during, and/or after the method 1000 depicted in FIGS. 10A-10B, and that some other processes may only be briefly described herein. In some embodiments, the method 1000 is usable to form ICs, such as IC structure 200 (FIGS. 2A-2D), other IC structures or the like.

In operation 1002 of method 1000, a first well layout pattern 104 is generated. In some embodiments, operation 1002 comprises operation 1002a. In operation 1002a of method 1000, a first layout pattern 104a and a second layout pattern 104b are generated.

Method 1000 continues with operation 1004, where the first well layout pattern 104 is placed on a first layout level. In some embodiments, operation 1004 comprises operation 1004a. In operation 1004a of method 1000, the first layout pattern 104a and the second layout pattern 104b are placed on the first layout level. In some embodiments, the first layout level is a level above substrate 201, 201' or 202.

Method 1000 continues with operation 1006, where a second well layout pattern 106 is generated. In some embodiments, the second well layout pattern of method 1000 is one or more of layout pattern 106a, layout pattern 106b or layout pattern 106c.

Method 1000 continues with operation 1008, where a second well layout pattern 106 is placed on the first layout level. The second well layout pattern 106 is placed adjacent to first well layout pattern 104 as shown in FIGS. 1A-1C.

Method 1000 continues with operation 1010, where a first implant layout pattern (e.g., implant layout pattern 110a) is generated. In some embodiments, the first implant layout pattern of method 1000 is first set of implant layout patterns 110 or first set of implant patterns 410. In some embodiments, the first implant layout pattern of method 1000 is one or more of implant layout pattern 110b, 110c, 332[0], 332[1], 332[2], 332[3], 410, 510a, 510b, 806c or 806d.

Method 1000 continues with operation 1012, where the first implant layout pattern (e.g., implant layout pattern 110a) is placed on a second layout level. In some embodiments, the second layout level is the level above the first layout level. In some embodiments, the first implant layout pattern (e.g., implant layout pattern 110a) is placed over the first layout pattern 104a.

Method 1000 continues with operation 1014, where a second implant layout pattern (e.g., implant layout pattern 108b) is generated. In some embodiments, the second implant layout pattern of method 1000 is second set of implant layout patterns 108 or second set of implant patterns 408. In some embodiments, the second implant layout pattern of method 1000 is one or more of implant layout pattern 108a, 330[0], 330[1], 330[2], 330[3], 408, 410, 508a, 508b, 806c or 806d.

Method 1000 continues with operation 1016, where the second implant layout pattern (e.g., implant layout pattern 108b) is placed on the second layout level. In some embodiments, the second implant layout pattern (e.g., implant layout pattern 108b) is placed over the second layout pattern 104b. In some embodiments, the second layout pattern 104b is between the first layout pattern 104a and the second well layout pattern 106. In some embodiments, the second implant layout pattern (e.g., implant layout pattern 108b) is between the first implant layout pattern (e.g., implant layout pattern 110a) and the third implant layout pattern (e.g., implant layout pattern 108a).

Method 1000 continues with operation 1018, where a third implant layout pattern (e.g., implant layout pattern 108a) is generated. In some embodiments, the third implant layout pattern of method 1000 is second set of implant layout patterns 108 or second set of implant patterns 408. In some embodiments, the third implant layout pattern of method 1000 is one or more of implant layout pattern 108b, 330[0], 330[1], 330[2], 330[3], 408, 410, 508a, 508b, 806c or 806d.

Method 1000 continues with operation 1020, where the third implant layout pattern (e.g., implant layout pattern 108a) is placed on the second layout level. In some embodiments, the third implant layout pattern (e.g., implant layout pattern 108a) is placed over layout pattern 106a.

Method 1000 continues with operation 1022, where a set of gate layout patterns 120 is generated. In some embodiments, the set of gate layout patterns of method 1000 is one or more of set of gate layout patterns 520 or 808.

Method 1000 continues with operation 1024, where the set of gate layout patterns 120 is placed on a third layout level. Third layout level is different from the first layout level or the second layout level. In some embodiments, the third layout level is the level above the first and second layout level.

Method 1000 continues with operation 1026, where a third well layout pattern (e.g., layout pattern 338 or 340) is generated. In some embodiments, the third well layout pattern of method 1000 is one or more of layout pattern 104a, 104b, 106a, 106b, 106c, well layout pattern 342, first well layout pattern 404, second well layout pattern 406, or well layout pattern 506a, 506b, 806a, 806b, 806c, 806d.

Method 1000 continues with operation 1028, where the third well layout pattern (e.g., layout pattern 338 or 340) is placed on the first layout level. The third well layout pattern (e.g., layout pattern 338 or 340) is adjacent to the first layout pattern 104a. In some embodiments, the third well layout pattern (e.g., layout pattern 338 or 340) is a portion of the second layout pattern 104b. In some embodiments, the third well layout pattern (e.g., layout pattern 338 or 340) is a separate layout pattern from the second layout pattern 104b.

Method 1000 continues with operation 1030, where a fourth implant layout pattern (e.g., implant layout pattern 330[0]) is generated. Fourth implant layout pattern (e.g., implant layout pattern 330[0]) is over the third well layout pattern (e.g., layout pattern 338 or 340). In some embodiments, the fourth implant layout pattern of method 1000 is one or more of implant layout pattern 108a, 108b, 330[0], 330[1], 330[2], 330[3], 332[0], 332[1], 332[2], 344, 346, 408, 410, 508a, 508b, 806c or 806d.

In some embodiments, at least one of the second layout pattern 104b, the third well layout pattern (e.g., layout pattern 338 or 340) or the fourth implant layout pattern (e.g., implant layout pattern 330[0]) continuously extend through the set of standard cell layout patterns (e.g., 304[0], 306[0], 401, 604, 608, 612) in the first direction X. In some embodiments, at least one of the first layout pattern 104a, the third well layout pattern (e.g., layout pattern 342) or the fourth implant layout pattern (e.g., implant layout pattern 332[0]) do not continuously extend through the set of standard cell layout patterns (e.g., 304[0], 306[0], 401, 604, 608, 612) in the first direction X.

Method 1000 continues with operation 1032, where the fourth implant layout pattern (e.g., implant layout pattern 330[0]) is placed on the second layout level.

In some embodiments, one or more of operations 1002, 1006, 1010, 1014, 1018, 1022, 1026 or 1030 is not performed.

One or more of operations 902, 904 or 1002-1032 is performed by a processing device configured to execute instructions for manufacturing an IC, such as IC structure 200. In some embodiments, one or more of operations 902, 904 or 1002-1032 is performed using a same processing device as that used in a different one or more of operations 902, 904 or 1002-1032. In some embodiments, a different processing device is used to perform one or more of operations 902, 904 or 1002-1032 from that used to perform a different one or more of operations 902, 904 or 1002-1032.

Figure 11:
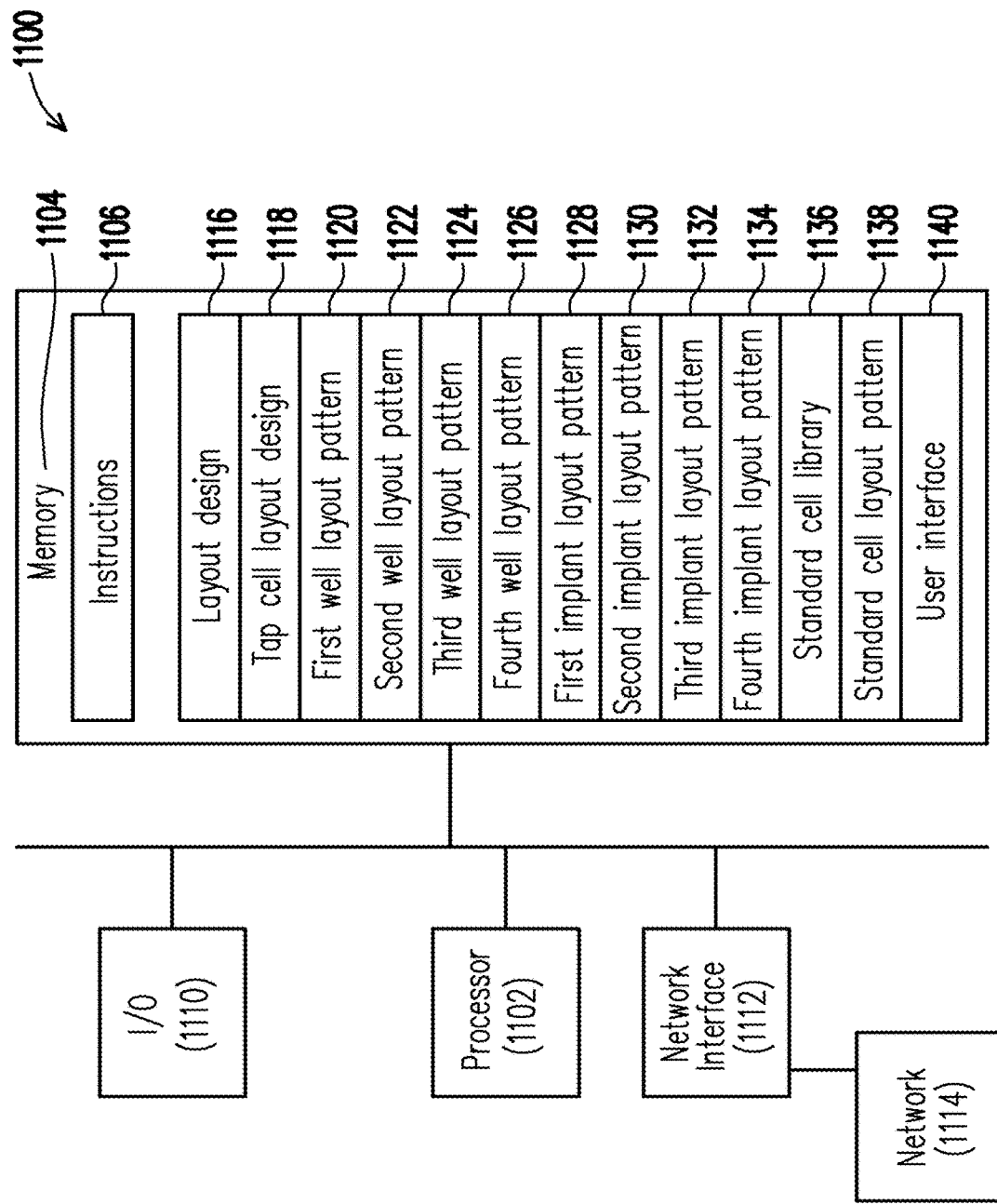
FIG. 11 is a block diagram of a system of designing an IC layout design, in accordance with some embodiments.

FIG. 11 is a schematic view of a system 1100 for designing an IC layout design in accordance with some embodiments. System 1100 includes a hardware processor 1102 and a non-transitory, computer readable storage medium 1104 encoded with, i.e., storing, the computer program code 1106, i.e., a set of executable instructions. Computer readable storage medium 1104 is also encoded with instructions 1107 for interfacing with manufacturing machines for producing the integrated circuit. The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described in method 900 or 1000.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electromagnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform method 900 or 1000. In some embodiments, the storage medium 1104 also stores information needed for performing method 900 or 1000 as well as information generated during performing method 900 or 1000, such as layout design 1116, tap cell layout pattern 1118, first well layout pattern 1120, second well layout pattern 1122, third well layout pattern 1124, fourth well layout pattern 1126, first implant layout pattern 1128, second implant layout pattern 1130, third implant layout pattern 1132, fourth implant layout pattern 1134, standard cell library 1136, standard cell layout pattern 1138, user interface 1140, and/or a set of executable instructions to perform the operation of method 900 or 1000.

In some embodiments, the storage medium 1104 stores instructions 1107 for interfacing with manufacturing machines. The instructions 1107 enable processor 1102 to generate manufacturing instructions readable by the manufacturing machines to effectively implement method 900 or 1000 during a manufacturing process.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-1394. In some embodiments, method 900 or 1000 is implemented in two or more systems 1100, and information such as layout design, tap cell layout pattern, first well layout pattern, second well layout pattern, third well layout pattern, fourth well layout pattern, first implant layout pattern, second implant layout pattern, third implant layout pattern, fourth implant layout pattern, standard cell library, standard cell layout pattern and user interface are exchanged between different systems 1100 by network 1114.

System 1100 is configured to receive information related to a layout design through I/O interface 1110 or network interface 1112. The information is transferred to processor 1102 by bus 1108 to determine a layout design for producing IC structure 200. The layout design is then stored in computer readable medium 1104 as layout design 1116. System 1100 is configured to receive information related to a tap cell layout pattern through I/O interface 1110 or network interface 1112. The information is stored in computer readable medium 1104 as tap cell layout pattern 1118. System 1100 is configured to receive information related to a first well layout pattern through I/O interface 1110 or network interface 1112. The information is stored in computer readable medium 1104 as first well layout pattern 1120. System 1100 is configured to receive information related to a second well layout pattern through I/O interface 1110 or network interface 1112. The information is stored in computer readable medium 1104 as second well layout pattern 1122. System 1100 is configured to receive information related to a third well layout pattern through I/O interface 1110 or network interface 1112. The information is stored in computer readable medium 1104 as third well layout pattern 1124. System 1100 is configured to receive information related to a fourth well layout pattern through I/O interface 1110 or network interface 1112. The information is stored in computer readable medium 1104 as fourth well layout pattern 1126. System 1100 is configured to receive information related to a first implant layout pattern through I/O interface 1110 or network interface 1112. The information is stored in computer readable medium 1104 as first implant layout pattern 1128. System 1100 is configured to receive information related to a second implant layout pattern through I/O interface 1110 or network interface 1112. The information is stored in computer readable medium 1104 as second implant layout pattern 1130. System 1100 is configured to receive information related to a third implant layout pattern through I/O interface 1110 or network interface 1112. The information is stored in computer readable medium 1104 as third implant layout pattern 1132. System 1100 is configured to receive information related to a fourth implant layout pattern through I/O interface 1110 or network interface 1112. The information is stored in computer readable medium 1104 as fourth implant layout pattern 1134. System 1100 is configured to receive information related to a standard cell library through I/O interface 1110 or network interface 1112. The information is stored in computer readable medium 1104 as standard cell library 1136. System 1100 is configured to receive information related to a standard cell layout pattern through I/O interface 1110 or network interface 1112. The information is stored in computer readable medium 1104 as standard cell layout pattern 1138. System 1100 is configured to receive information related to a user interface through I/O interface 1110 or network interface 1112. The information is stored in computer readable medium 1104 as user interface 1140.

In some embodiments, method 900 or 1000 is implemented as a standalone software application for execution by a processor. In some embodiments, method 900 or 1000 is implemented as a software application that is a part of an additional software application. In some embodiments, method 900 or 1000 is implemented as a plug-in to a software application. In some embodiments, method 900 or 1000 is implemented as a software application that is a portion of an EDA tool. In some embodiments, method 900 or 1000 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design.

System 1100 of FIG. 11 generates layout designs (e.g., layout design 100, 300, 400, 500, 500', 600, 700, 800) of IC structure 200 that occupy less area than other approaches. Components that are the same or similar to those in FIGS. 1A-1C, 2A-2D, 3A-3C, 4A-4C, 5A-5B, 6-9 and 10A-10B are given the same reference numbers, and detailed description thereof is thus omitted.

One aspect of this description relates to an integrated circuit structure. In some embodiments, the integrated circuit structure includes a first well, a second well, a third well, a first set of implants and a second set of implants. In some embodiments, the first well includes a first dopant type, a first portion extending in a first direction and having a first width, and a second portion adjacent to the first portion of the first well, extending in the first direction and having a second width greater than the first width. In some embodiments, the second well has a second dopant type different from the first dopant type, the second well adjacent to the first well. In some embodiments, the third well has the second dopant type, is adjacent to the first well. The first portion of the first well is between the second well and the third well. In some embodiments, the first set of implants is in the first portion of the first well, the second well and the third well. Each implant of the first set of implants has the first dopant type and is separated from each other in the first direction. At least one implant of the first set of implants is configured to be coupled to a first supply voltage. In some embodiments, the second set of implants is in the second portion of the first well. Each implant of the second set of implants has the second dopant type and is separated from each other in the first direction. The second set of implants is separated from the first set of implants in a second direction different from the first direction.

Another aspect of this description relates to an integrated circuit structure. In some embodiments, the integrated circuit structure includes a first tap cell, a second tap cell, a first set of standard cells, a first set of implants and a second set of implants. In some embodiments, the first tap cell includes a first portion of a first well extending in a first direction, having a first width and having a first dopant type. In some embodiments, the first tap cell further includes a second portion of the first well adjacent to the first portion of the first well, the second portion of the first well extending in the first direction, having the first dopant type, and having a second width greater than the first width. In some embodiments, the second tap cell is separated from the first tap cell in the first direction. In some embodiments, the first set of standard cells is between the first tap cell and the second tap cell. In some embodiments, the first set of implants is in the first portion of the first well, each implant of the first set of implants having the first dopant type and being separated from each other in the first direction, and at least one implant of the first set of implants being configured to be coupled to a first supply voltage. In some embodiments, the second set of implants is in the second portion of the first well, each implant of the second set of implants having a second dopant type different from the first dopant type and being separated from each other in the first direction, and the second set of implants being separated from the first set of implants in a second direction different from the first direction.

Still another aspect of this description relates to a method of forming an integrated circuit structure. In some embodiments, the method includes generating a first well layout pattern corresponding to fabricating a first well in the integrated circuit structure, the first well having a first dopant type. In some embodiments, the generating the first well layout pattern includes generating a first layout pattern extending in a first direction and having a first width, the first layout pattern corresponding to fabricating a first portion of the first well. In some embodiments, the generating the first well layout pattern further includes generating a second layout pattern extending in the first direction, being adjacent to the first layout pattern, and having a second width greater than the first width, the second layout pattern corresponding to fabricating a second portion of the first well. In some embodiments, the method further includes generating a first implant layout pattern extending in the first direction, overlapping the first layout pattern and having a third width greater than the first width, the first implant layout pattern corresponding to fabricating a first set of implants in the first portion of the first well of the integrated circuit structure, each implant of the first set of implants having the first dopant type and being separated from each other in the first direction, and at least one implant of the first set of implants being configured to be coupled to a first supply voltage. In some embodiments, the method further includes generating a second implant layout pattern extending in the first direction, being adjacent to the first implant layout pattern, being over the second layout pattern and having a fourth width, the second implant layout pattern corresponding to fabricating a second set of implants in the second portion of the first well of the integrated circuit structure, each implant of the second set of implants having a second dopant type and being separated from each other in the first direction. In some embodiments, at least one of the above layout patterns is stored on a non-transitory computer-readable medium, and at least one of the above operations is performed by a hardware processor. In some embodiments, the method further includes manufacturing the integrated circuit structure based on at least one of the above layout patterns of the integrated circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a first well, the first well comprising:
      a first dopant type;
      a first portion extending in a first direction and having a first width, and
      a second portion adjacent to the first portion of the first well, extending in the first direction and having a second width greater than the first width;
   a second well having a second dopant type different from the first dopant type, the second well adjacent to the first well;
   a third well having the second dopant type, the third well adjacent to the first well, the first portion of the first well is between the second well and the third well;
   a first set of implants in the first portion of the first well, the second well and the third well, each implant of the first set of implants having the first dopant type and being separated from each other in the first direction, and at least one implant of the first set of implants being configured to be coupled to a first supply voltage, and
   a second set of implants in the second portion of the first well, each implant of the second set of implants having the second dopant type and being separated from each other in the first direction, and the second set of implants being separated from the first set of implants in a second direction different from the first direction.

2. The integrated circuit structure of claim 1, further comprising:
   a fourth well adjacent to the second portion of the first well, the fourth well having the second dopant type and a third width greater than the first width, the fourth well being separated from the first portion of the first well in the second direction.

3. The integrated circuit structure of claim 2, further comprising:
   a third set of implants in a first portion of the fourth well, each implant of the third set of implants having the second dopant type and being separated from each other in the first direction, and at least one implant of the third set of implants being configured to be coupled to a second supply voltage different from the first supply voltage.

4. The integrated circuit structure of claim 3, further comprising:
   a fourth set of implants in a second portion of the fourth well, each implant of the fourth set of implants having the first dopant type and being separated from each other in the first direction; and
   a fifth set of implants in a third portion of the fourth well, each implant of the fifth set of implants having the first dopant type and being separated from each other in the first direction,
   wherein the first portion of the fourth well is between the second portion of the fourth well and the third portion of the fourth well.

5. The integrated circuit structure of claim 2, further comprising:
   a set of standard cells comprising a set of transistors, the set of standard cells being arranged in rows and columns, the second well is part of the set of standard cells,
   wherein the second portion of the first well continuously extends through the set of standard cells in the first direction.

6. The integrated circuit structure of claim 5, wherein
   the second set of implants are arranged to continuously extend through the set of standard cells in the first direction, and
   the first portion of the first well is arranged to not continuously extend through the set of standard cells in the first direction.

7. The integrated circuit structure of claim 6, wherein the set of transistors comprises:
   a sub-set of P-type transistors being located within the second portion of the first well; and
   a sub-set of N-type transistors being located in the second well and the fourth well.

8. The integrated circuit structure of claim 1, further comprising:
   a set of gates extending in the second direction and overlapping the first well, at least an implant of the second set of implants is between a pair of gates of the set of gates, and the set of gates being separated from each other in the first direction.

9. An integrated circuit structure comprising:
   a first tap cell, the first tap cell comprising:
      a first portion of a first well extending in a first direction, having a first width and having a first dopant type; and
      a second portion of the first well adjacent to the first portion of the first well, the second portion of the first well extending in the first direction, having the first dopant type, and having a second width greater than the first width;
   a second tap cell separated from the first tap cell in the first direction;
   a first set of standard cells between the first tap cell and the second tap cell;
   a first set of implants in the first portion of the first well, each implant of the first set of implants having the first dopant type and being separated from each other in the first direction, and at least one implant of the first set of implants being configured to be coupled to a first supply voltage; and
   a second set of implants in the second portion of the first well, each implant of the second set of implants having a second dopant type different from the first dopant type and being separated from each other in the first direction, and the second set of implants being separated from the first set of implants in a second direction different from the first direction.

10. The integrated circuit structure of claim 9, wherein the first tap cell further comprises:
    a second well extending in the first direction and being adjacent to the second portion of the first well, the second well having the second dopant type and a third width, the second well being separated from the first portion of the first well in the second direction; and
    a third set of implants in the second well, each implant of the third set of implants having the second dopant type and being separated from each other in the first direction, and at least one implant of the third set of implants being configured to be coupled to a second supply voltage different from the first supply voltage.

11. The integrated circuit structure of claim 10, wherein the second tap cell comprises:
a third well comprising:
a first portion of the third well extending in the first direction, having a fourth width, the first dopant type, and being aligned with the second well in the first direction; and
a second portion of the third well extending in the first direction and being adjacent to the first portion of the third well, having the first dopant type, and having a fifth width greater than the fourth width, and being aligned with the second portion of the first well in the first direction.

12. The integrated circuit structure of claim 11, wherein the second tap cell further comprises:
a fourth set of implants in the first portion of the third well, each implant of the fourth set of implants having the first dopant type and being separated from each other in the first direction, and at least one implant of the fourth set of implants being configured to be coupled to the first supply voltage; and
a fifth set of implants in the second portion of the third well, each implant of the fifth set of implants having the second dopant type and being separated from each other in the first direction.

13. The integrated circuit structure of claim 12, wherein the second tap cell further comprises:
a fourth well extending in the first direction and being adjacent to the second portion of the third well, the fourth well having the second dopant type and a sixth width, the fourth well aligned with the first portion of the third well in the second direction; and
a sixth set of implants in the fourth well, each implant of the sixth set of implants having the second dopant type and being separated from each other in the first direction, and at least one implant of the sixth set of implants being configured to be coupled to the second supply voltage.

14. The integrated circuit structure of claim 13, wherein the first set of standard cells comprises a set of transistors, the first set of standard cells being arranged in rows and columns,
the second portion of the first well continuously extends through the first set of standard cells in the first direction, and is connected to the second portion of the third well, and
the second set of implants is arranged to continuously extend through the first set of standard cells in the first direction.

15. An integrated circuit structure comprising:
a first well on a first level, the first well comprising:
a first dopant type;
a first portion extending in a first direction and having a first width, and
a second portion adjacent to the first portion of the first well, extending in the first direction and having a second width greater than the first width;
a second well having a second dopant type different from the first dopant type, the second well adjacent to the first well, and on the first level;
a third well having the second dopant type, the third well adjacent to the first well, and on the first level, the first portion of the first well is between the second well and the third well;
a first set of implants in the first portion of the first well, the second well and the third well, each implant of the first set of implants having the first dopant type and being separated from each other in the first direction, and at least one implant of the first set of implants being configured to be coupled to a supply voltage;
a second set of implants in the second portion of the first well, each implant of the second set of implants having the second dopant type and being separated from each other in the first direction, and the second set of implants being separated from the first set of implants in a second direction different from the first direction; and
a set of gates on a second level different from the first level, the set of gates extending in the second direction and overlapping the first well and the second well, at least an implant of the first set of implants is between a pair of gates of the set of gates over the first portion of the first well, and the set of gates being separated from each other in the first direction.

16. The integrated circuit structure of claim 15, further comprising:
a fourth well adjacent to the second portion of the first well, and on the first level, the fourth well having the second dopant type and a third width greater than the first width, the fourth well being separated from the first portion of the first well in the second direction.

17. The integrated circuit structure of claim 16, further comprising:
a third set of implants in a first portion of the fourth well, each implant of the third set of implants having the first dopant type and being separated from each other in the first direction; and
a fourth set of implants in a second portion of the fourth well, each implant of the fourth set of implants having the first dopant type and being separated from each other in the first direction,
wherein the first portion of the fourth well is separated from the second portion of the fourth well in the first direction.

18. The integrated circuit structure of claim 17, further comprising:
a fifth set of implants in a third portion of the fourth well, each implant of the fifth set of implants having the second dopant type and being separated from each other in the first direction, and at least one implant of the fifth set of implants being configured to be coupled to a reference supply voltage,
wherein the third portion of the fourth well is between the first portion of the fourth well and the second portion of the fourth well.

19. The integrated circuit structure of claim 16, further comprising:
a first set of standard cells comprising a first set of transistors, the first set of standard cells being arranged in rows and columns, the second well being part of the first set of standard cells,
wherein the second portion of the first well continuously extends through the first set of standard cells in the first direction.

20. The integrated circuit structure of claim 19, wherein a second set of standard cells comprising a second set of transistors, the second set of standard cells being arranged in rows and columns, the third well being part of the second set of standard cells,
wherein the second portion of the first well continuously extends through the second set of standard cells in a third direction opposite from the first direction.

* * * * *